(12) United States Patent
Nagahara et al.

(10) Patent No.: US 7,217,654 B2
(45) Date of Patent: May 15, 2007

(54) SEMICONDUCTOR DEVICE AND METHOD OF MANUFACTURING THE SAME

(75) Inventors: Seiji Nagahara, Kanagawa (JP); Kazutoshi Shiba, Kanagawa (JP); Nobuaki Hamanaka, Kanagawa (JP); Tatsuya Usami, Kanagawa (JP); Takashi Yokoyama, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 125 days.

(21) Appl. No.: 10/969,429

(22) Filed: Oct. 21, 2004

(65) Prior Publication Data

US 2005/0124168 A1    Jun. 9, 2005

Related U.S. Application Data

(62) Division of application No. 10/303,715, filed on Nov. 26, 2002.

(30) Foreign Application Priority Data

Nov. 27, 2001  (JP) ............... 2001-361112
Nov. 22, 2002  (JP) ............... 2002-340160

(51) Int. Cl.
   *H01L 21/4763* (2006.01)
(52) U.S. Cl. .............. 438/637; 438/672; 438/675; 438/677; 257/E21.577; 257/E21.579
(58) Field of Classification Search ......... 438/677
   See application file for complete search history.

(56) References Cited

U.S. PATENT DOCUMENTS

| 6,350,675 | B1 * | 2/2002 | Chooi et al. ............ 438/624 |
| 6,583,047 | B2 * | 6/2003 | Daniels et al. .......... 438/623 |
| 2002/0081855 | A1 * | 6/2002 | Jiang et al. ........... 438/694 |

FOREIGN PATENT DOCUMENTS

JP    2000-077409    3/2000

OTHER PUBLICATIONS

Ebbing, General Chemistry, 1993, Houghton Mifflin Company, 4th Ed., p. G-16.*

* cited by examiner

*Primary Examiner*—Jerome Jackson
*Assistant Examiner*—José R. Díaz
(74) *Attorney, Agent, or Firm*—Young & Thompson

(57) ABSTRACT

A method of manufacturing a semiconductor device having a damascene structure contains a process of forming a first interlayer insulating film (6) and a second interlayer insulating film (4) formed of a low dielectric-constant film on a substrate, forming via holes (9) by using a first resist pattern (1a) formed on the second interlayer insulating film, conducting an organic peeling treatment using organic peeling liquid containing amine components and then forming a second resist pattern (1b) on the second interlayer insulating film. After the wet treatment, before a second antireflection coating (2b) is coated so as to be located below the second resist pattern is coated, at least one of an annealing treatment, a plasma treatment, a UV treatment and an organic solvent treatment is carried out to remove amine components which inhibit the catalysis reaction of acid occurring in the resist at the light exposure, thereby preventing degradation of the resolution of the second resist pattern (1b).

5 Claims, 28 Drawing Sheets

4;SECOND INTERLAYER INSULATING FILM
5;SECOND ETCHING STOP FILM
6;FIRST INTERLAYER INSULATING FILM
7;FIRST ETCHING STOP FILM
8;WIRING SUBSTRATE
11;WIRING MATERIAL

FIG.1A

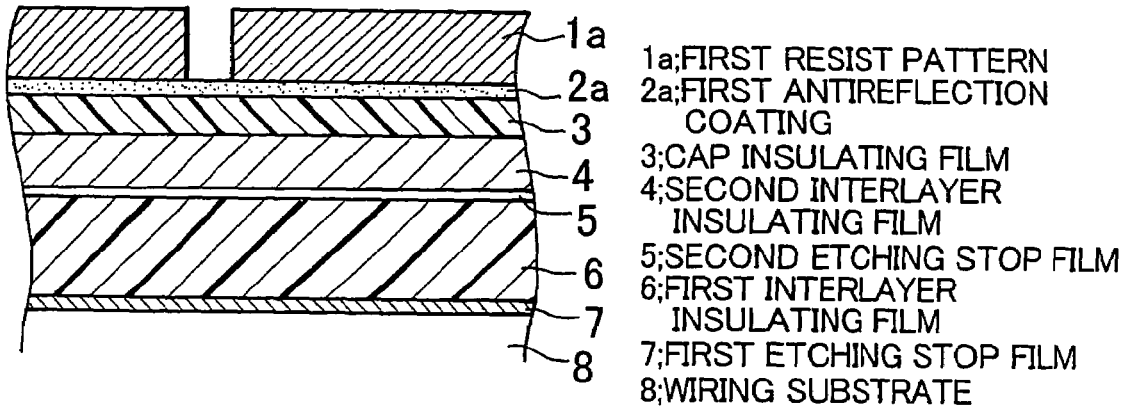

1a;FIRST RESIST PATTERN
2a;FIRST ANTIREFLECTION COATING
3;CAP INSULATING FILM
4;SECOND INTERLAYER INSULATING FILM
5;SECOND ETCHING STOP FILM
6;FIRST INTERLAYER INSULATING FILM
7;FIRST ETCHING STOP FILM
8;WIRING SUBSTRATE

FIG.1B

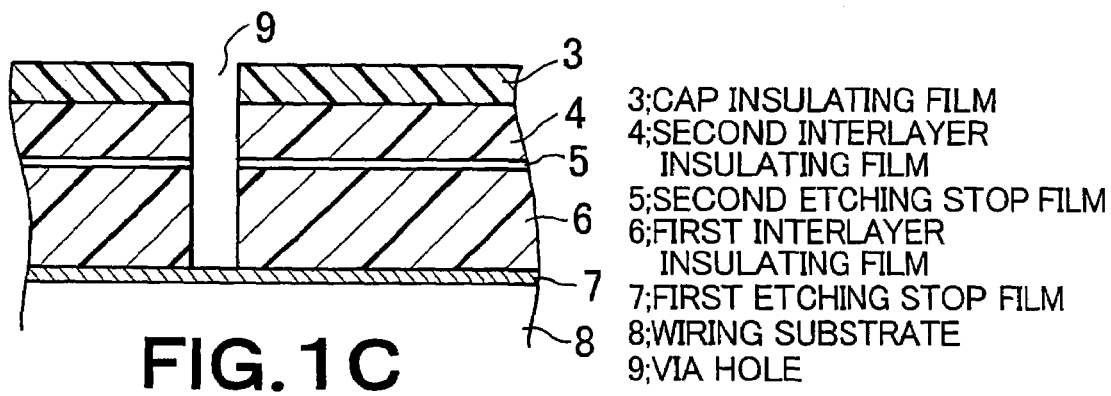

3;CAP INSULATING FILM
4;SECOND INTERLAYER INSULATING FILM
5;SECOND ETCHING STOP FILM
6;FIRST INTERLAYER INSULATING FILM
7;FIRST ETCHING STOP FILM
8;WIRING SUBSTRATE
9;VIA HOLE

ANNEALING TREATMENT,PLASMA TREATMENT,
UV TREATMENT,ORGANIC SOLVENT TREATMENT

⇩

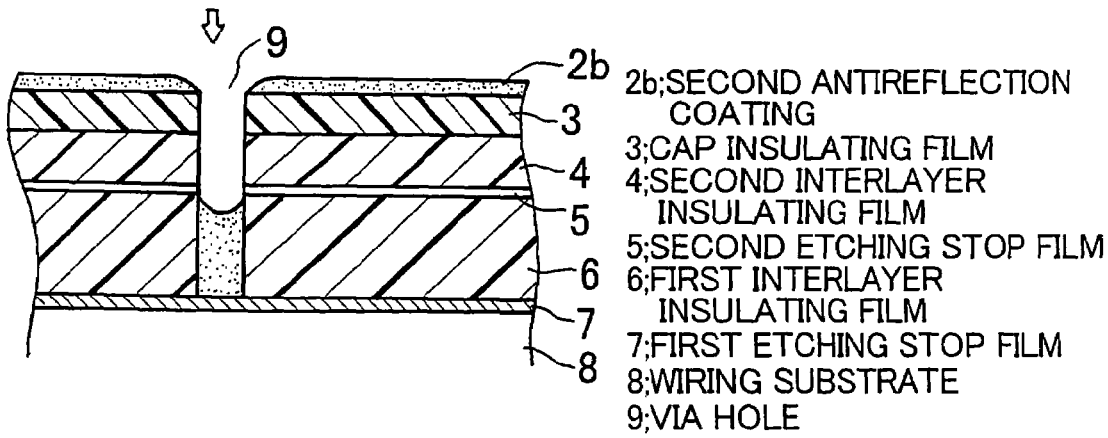

2b;SECOND ANTIREFLECTION COATING
3;CAP INSULATING FILM
4;SECOND INTERLAYER INSULATING FILM
5;SECOND ETCHING STOP FILM
6;FIRST INTERLAYER INSULATING FILM
7;FIRST ETCHING STOP FILM
8;WIRING SUBSTRATE
9;VIA HOLE

FIG.2A

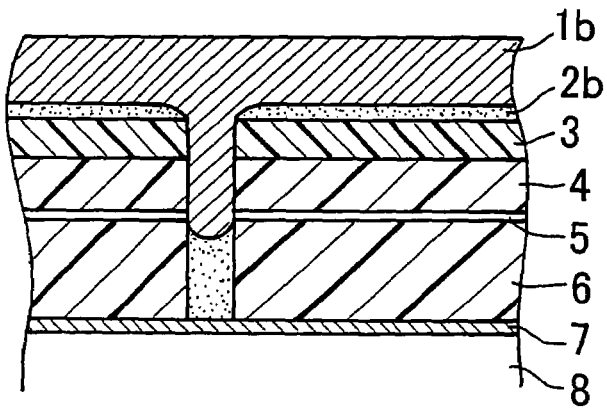

- 1b; SECOND RESIST PATTERN
- 2b; SECOND ANTIREFLECTION COATING
- 3; CAP INSULATING FILM
- 4; SECOND INTERLAYER INSULATING FILM
- 5; SECOND ETCHING STOP FILM
- 6; FIRST INTERLAYER INSULATING FILM
- 7; FIRST ETCHING STOP FILM
- 8; WIRING SUBSTRATE

FIG.2B

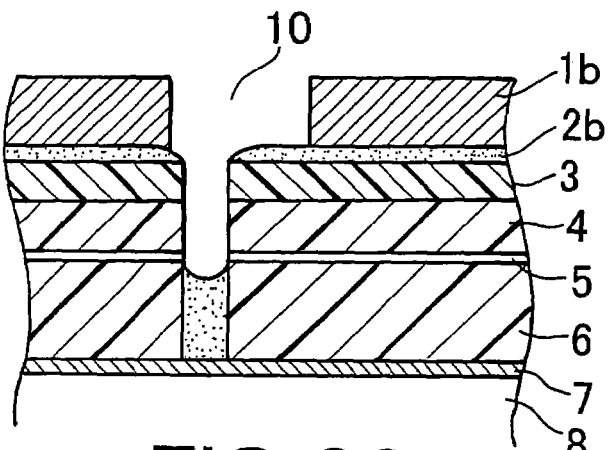

- 1b; SECOND RESIST PATTERN
- 2b; SECOND ANTIREFLECTION COATING
- 3; CAP INSULATING FILM
- 4; SECOND INTERLAYER INSULATING FILM
- 5; SECOND ETCHING STOP FILM
- 6; FIRST INTERLAYER INSULATING FILM
- 7; FIRST ETCHING STOP FILM
- 8; WIRING SUBSTRATE
- 10; WIRING TRENCH PATTERN

FIG.2C

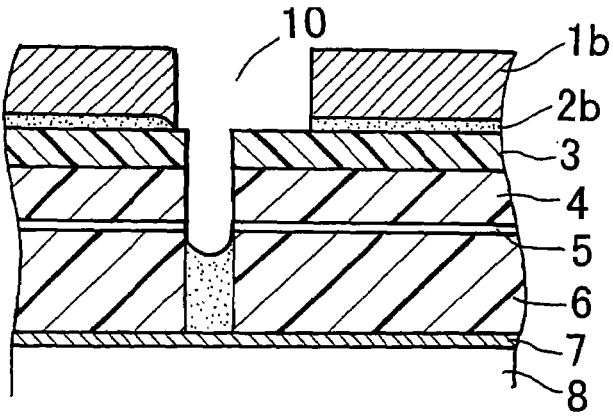

- 1b; SECOND RESIST PATTERN
- 2b; SECOND ANTIREFLECTION COATING
- 3; CAP INSULATING FILM
- 4; SECOND INTERLAYER INSULATING FILM
- 5; SECOND ETCHING STOP FILM
- 6; FIRST INTERLAYER INSULATING FILM
- 7; FIRST ETCHING STOP FILM
- 8; WIRING SUBSTRATE
- 10; WIRING TRENCH PATTERN

FIG.3A

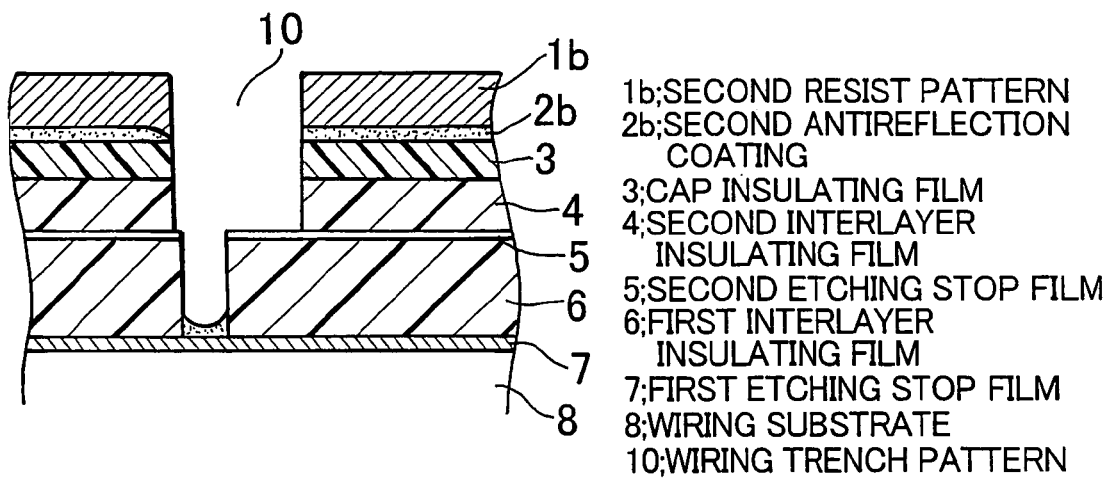

1b; SECOND RESIST PATTERN
2b; SECOND ANTIREFLECTION COATING
3; CAP INSULATING FILM
4; SECOND INTERLAYER INSULATING FILM
5; SECOND ETCHING STOP FILM
6; FIRST INTERLAYER INSULATING FILM
7; FIRST ETCHING STOP FILM
8; WIRING SUBSTRATE
10; WIRING TRENCH PATTERN

FIG.3B

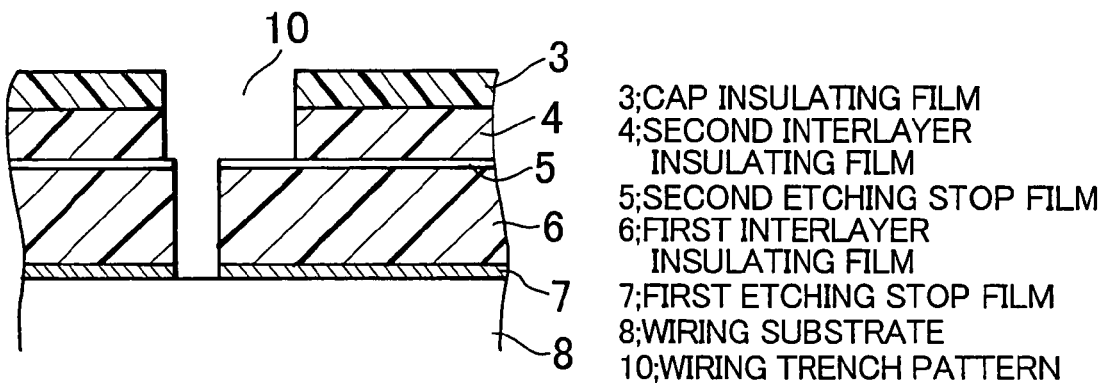

3; CAP INSULATING FILM
4; SECOND INTERLAYER INSULATING FILM
5; SECOND ETCHING STOP FILM
6; FIRST INTERLAYER INSULATING FILM
7; FIRST ETCHING STOP FILM
8; WIRING SUBSTRATE
10; WIRING TRENCH PATTERN

FIG.3C

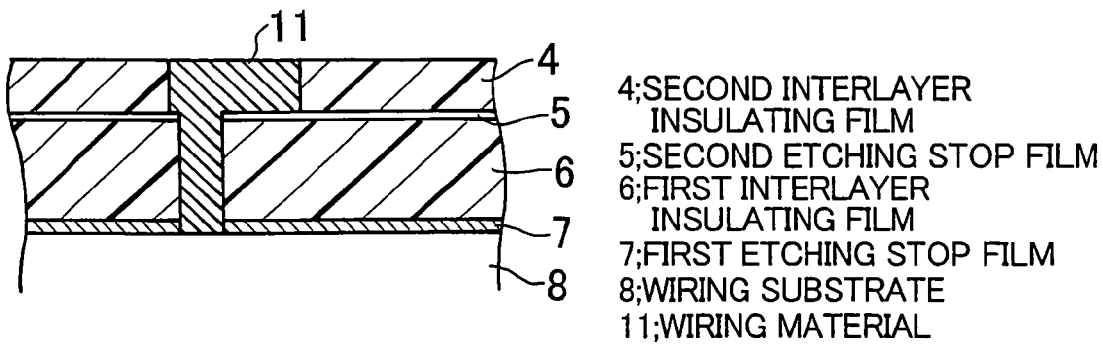

4; SECOND INTERLAYER INSULATING FILM
5; SECOND ETCHING STOP FILM
6; FIRST INTERLAYER INSULATING FILM
7; FIRST ETCHING STOP FILM
8; WIRING SUBSTRATE
11; WIRING MATERIAL

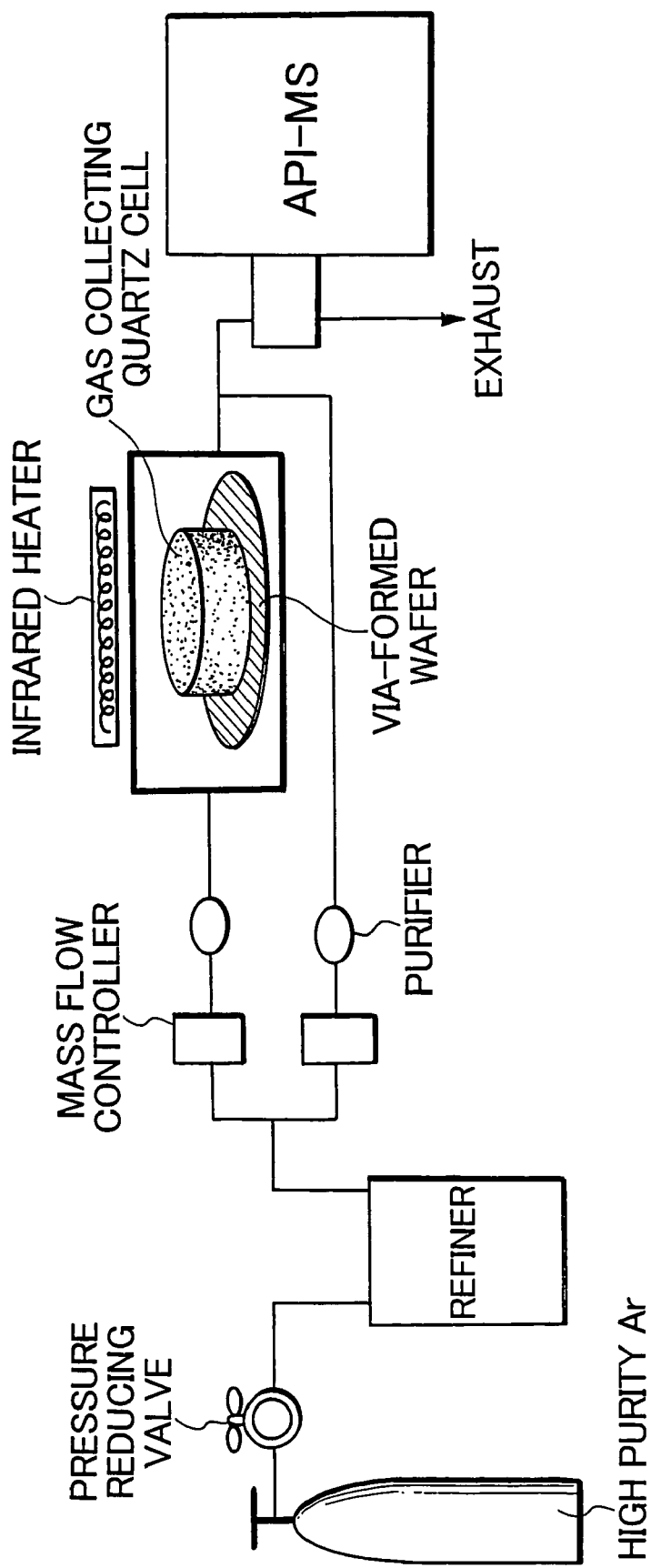

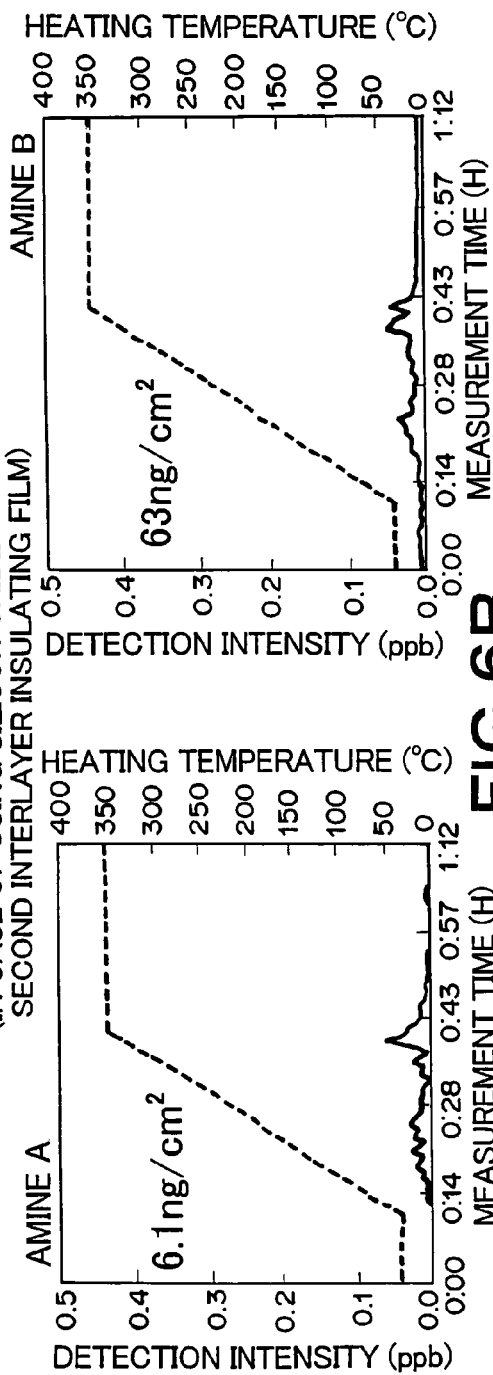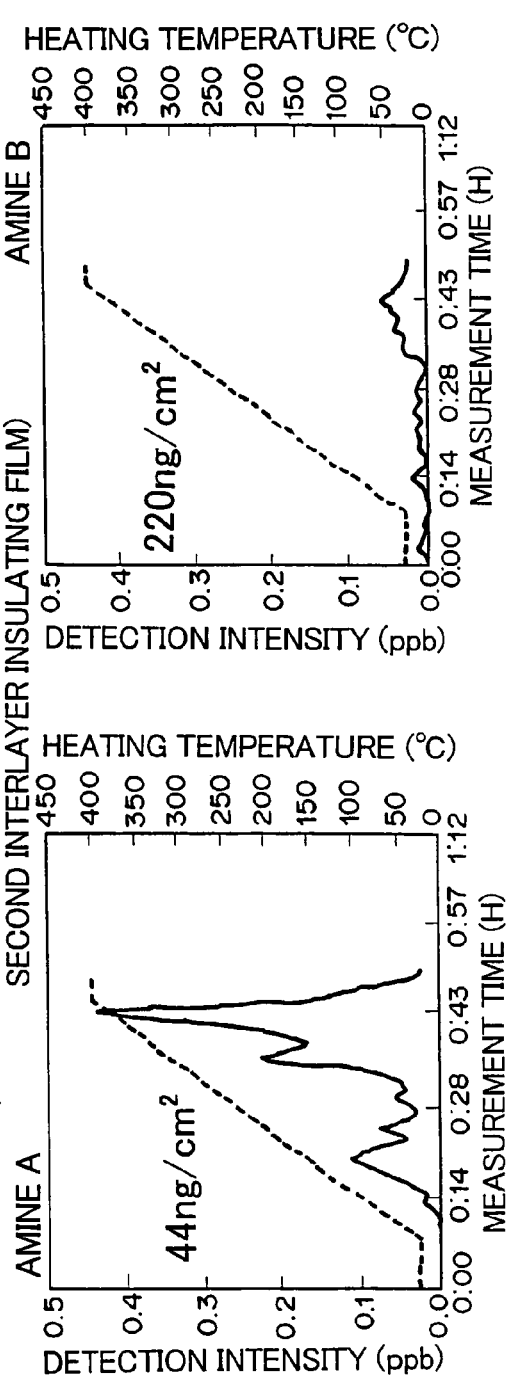
FIG.6A (IN CASE OF USING SILICON OXIDE FILM AS SECOND INTERLAYER INSULATING FILM)
FIG.6B (IN CASE OF USING LOW DIELECTRIC-CONSTANT FILM AS SECOND INTERLAYER INSULATING FILM)

IN CASE OF USING SILICON OXIDE FILM AS
SECOND INTERLAYER INSULATING FILM

PATTERN MISSING PART

9 : VIA HOLE

IN CASE OF USING LOW DIELECTRIC-CONSTANT
FILM AS SECOND INTERLAYER INSULATING FILM

1b; SECOND RESIST PATTERN
2b; SECOND ANTIREFLECTION COATING
3; CAP INSULATING FILM
4; SECOND INTERLAYER INSULATING FILM
5; SECOND ETCHING STOP FILM
6; FIRST INTERLAYER INSULATING FILM
7; FIRST ETCHING STOP FILM
8; WIRING SUBSTRATE

NO TREATMENT

UV TREATMENT

NUMBER OF RESIDUALS ON THIS LINE

5 LINES

NO TREATMENT

NUMBER OF RESIDUALS ON THIS LINE

4 LINES

THINNER TREATMENT

NUMBER OF RESIDUALS ON THIS LINE

1 LINE

ACIDIC THINNER TREATMENT

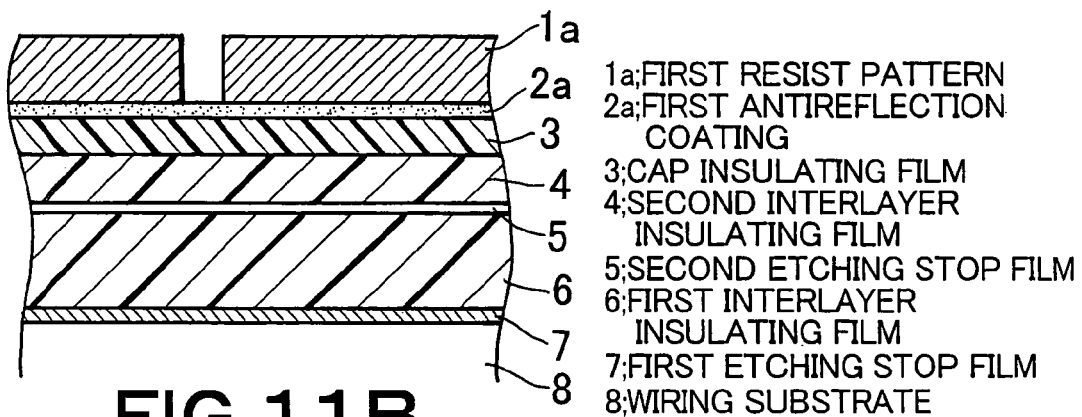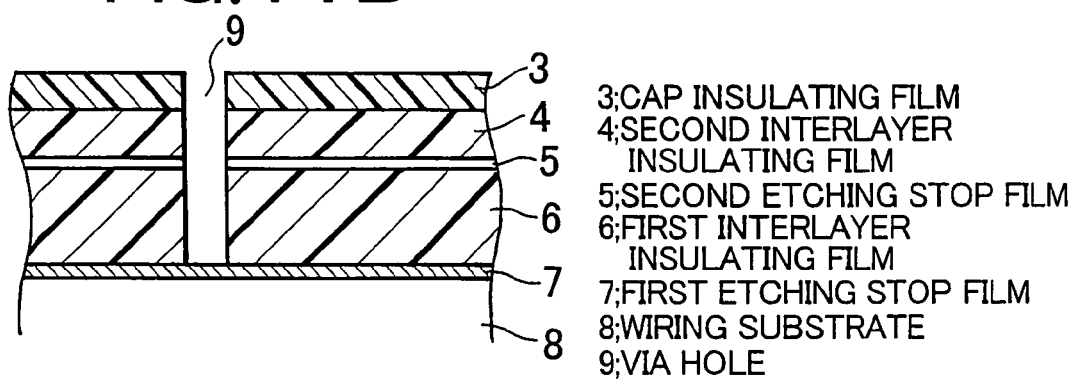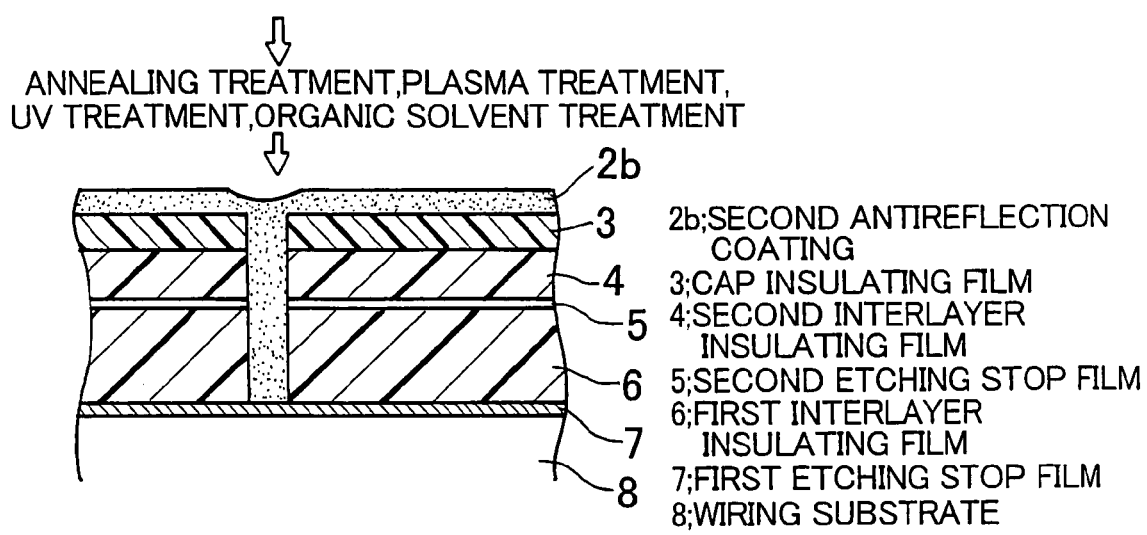

FIG.12A

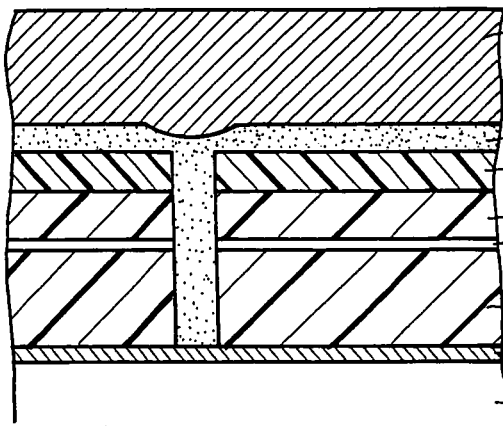

- 1b; SECOND RESIST PATTERN
- 2b; SECOND ANTIREFLECTION COATING
- 3; CAP INSULATING FILM
- 4; SECOND INTERLAYER INSULATING FILM
- 5; SECOND ETCHING STOP FILM
- 6; FIRST INTERLAYER INSULATING FILM
- 7; FIRST ETCHING STOP FILM
- 8; WIRING SUBSTRATE

FIG.12B

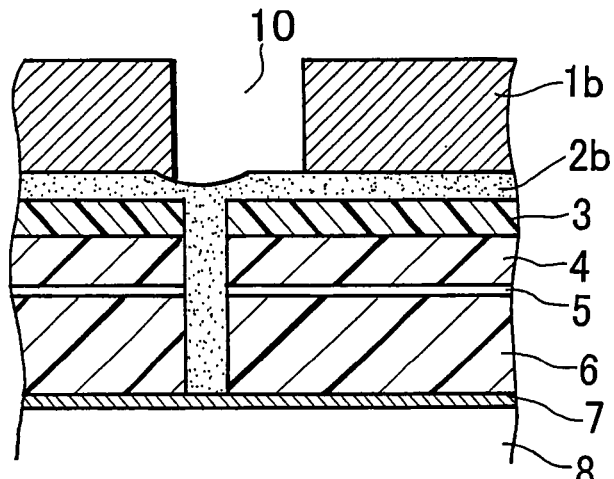

- 1b; SECOND RESIST PATTERN
- 2b; SECOND ANTIREFLECTION COATING
- 3; CAP INSULATING FILM
- 4; SECOND INTERLAYER INSULATING FILM
- 5; SECOND ETCHING STOP FILM
- 6; FIRST INTERLAYER INSULATING FILM
- 7; FIRST ETCHING STOP FILM
- 8; WIRING SUBSTRATE
- 10; WIRING TRENCH PATTERN

FIG.12C

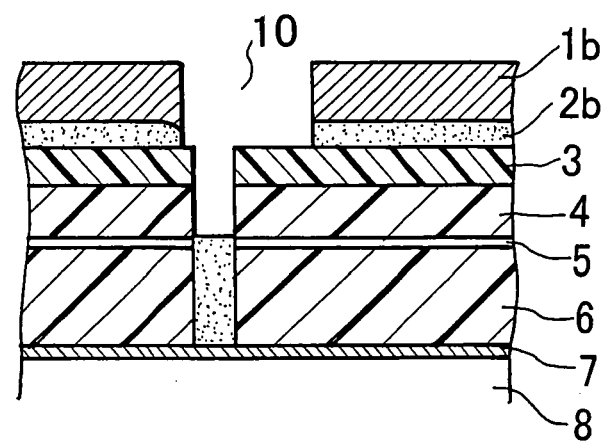

- 1b; SECOND RESIST PATTERN
- 2b; SECOND ANTIREFLECTION COATING
- 3; CAP INSULATING FILM
- 4; SECOND INTERLAYER INSULATING FILM
- 5; SECOND ETCHING STOP FILM
- 6; FIRST INTERLAYER INSULATING FILM
- 7; FIRST ETCHING STOP FILM
- 8; WIRING SUBSTRATE
- 10; WIRING TRENCH PATTERN

FIG.13A

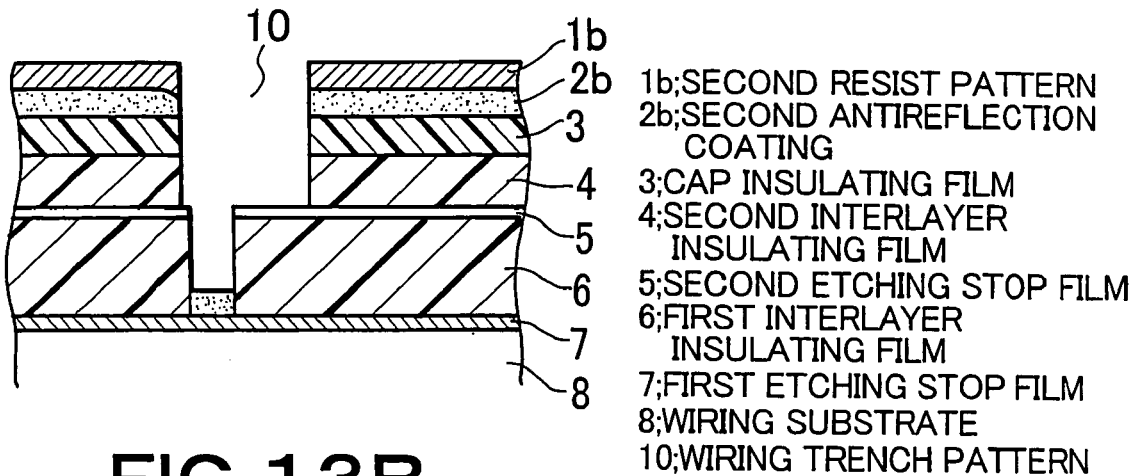

- 1b; SECOND RESIST PATTERN
- 2b; SECOND ANTIREFLECTION COATING
- 3; CAP INSULATING FILM
- 4; SECOND INTERLAYER INSULATING FILM
- 5; SECOND ETCHING STOP FILM
- 6; FIRST INTERLAYER INSULATING FILM
- 7; FIRST ETCHING STOP FILM
- 8; WIRING SUBSTRATE
- 10; WIRING TRENCH PATTERN

FIG.13B

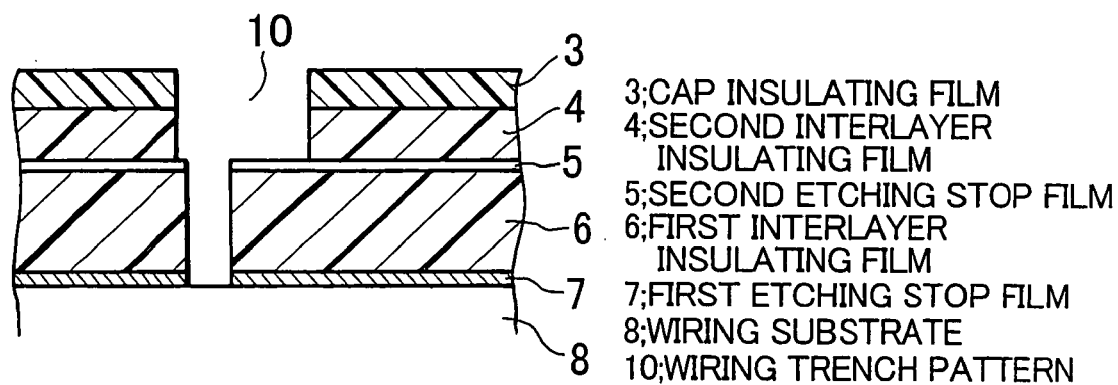

- 3; CAP INSULATING FILM
- 4; SECOND INTERLAYER INSULATING FILM
- 5; SECOND ETCHING STOP FILM
- 6; FIRST INTERLAYER INSULATING FILM
- 7; FIRST ETCHING STOP FILM
- 8; WIRING SUBSTRATE
- 10; WIRING TRENCH PATTERN

FIG.13C

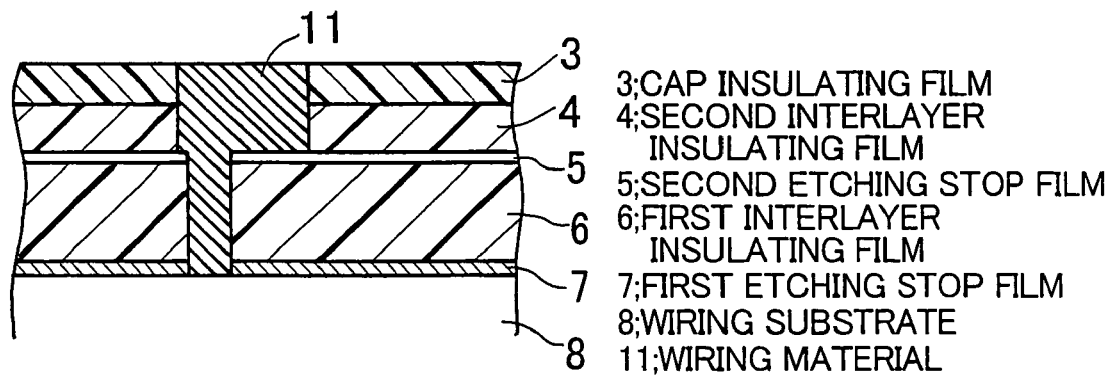

- 3; CAP INSULATING FILM
- 4; SECOND INTERLAYER INSULATING FILM
- 5; SECOND ETCHING STOP FILM
- 6; FIRST INTERLAYER INSULATING FILM
- 7; FIRST ETCHING STOP FILM
- 8; WIRING SUBSTRATE
- 11; WIRING MATERIAL

FIG.14A

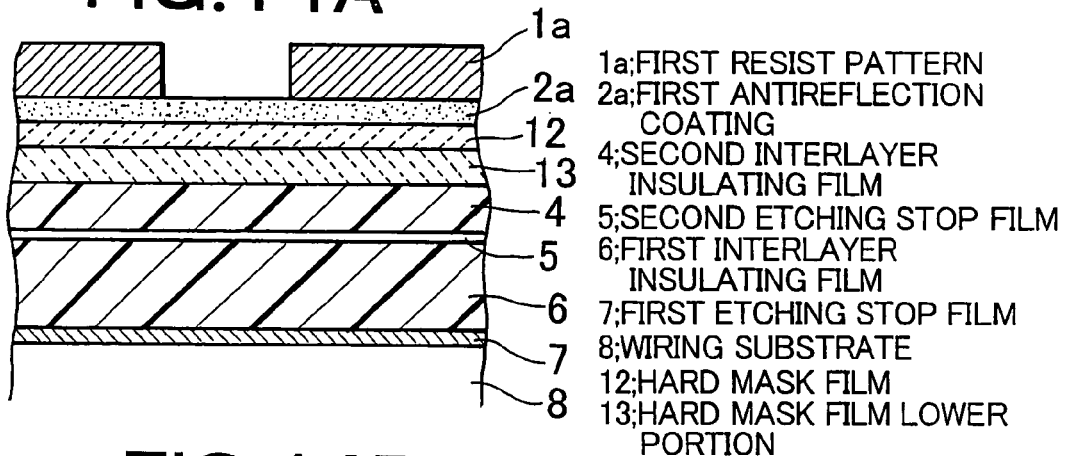

- 1a; FIRST RESIST PATTERN
- 2a; FIRST ANTIREFLECTION COATING
- 4; SECOND INTERLAYER INSULATING FILM
- 5; SECOND ETCHING STOP FILM
- 6; FIRST INTERLAYER INSULATING FILM
- 7; FIRST ETCHING STOP FILM
- 8; WIRING SUBSTRATE
- 12; HARD MASK FILM
- 13; HARD MASK FILM LOWER PORTION

FIG.14B

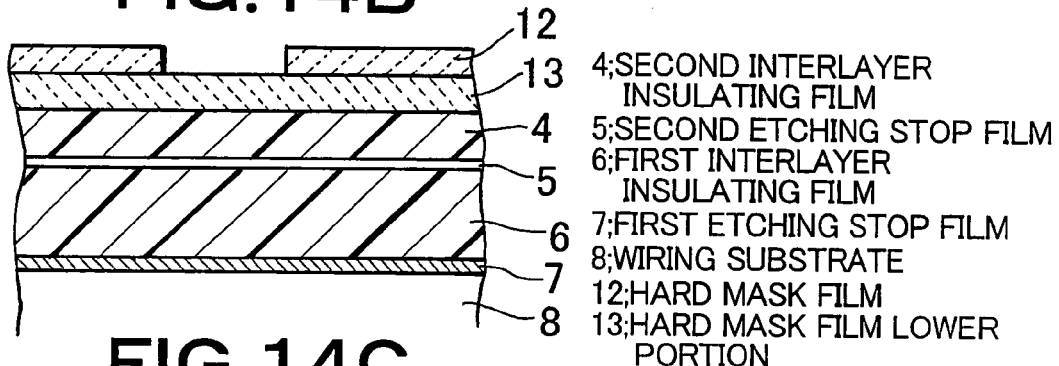

- 4; SECOND INTERLAYER INSULATING FILM
- 5; SECOND ETCHING STOP FILM
- 6; FIRST INTERLAYER INSULATING FILM
- 7; FIRST ETCHING STOP FILM
- 8; WIRING SUBSTRATE
- 12; HARD MASK FILM
- 13; HARD MASK FILM LOWER PORTION

FIG.14C

ANNEALING TREATMENT, PLASMA TREATMENT, UV TREATMENT, ORGANIC SOLVENT TREATMENT

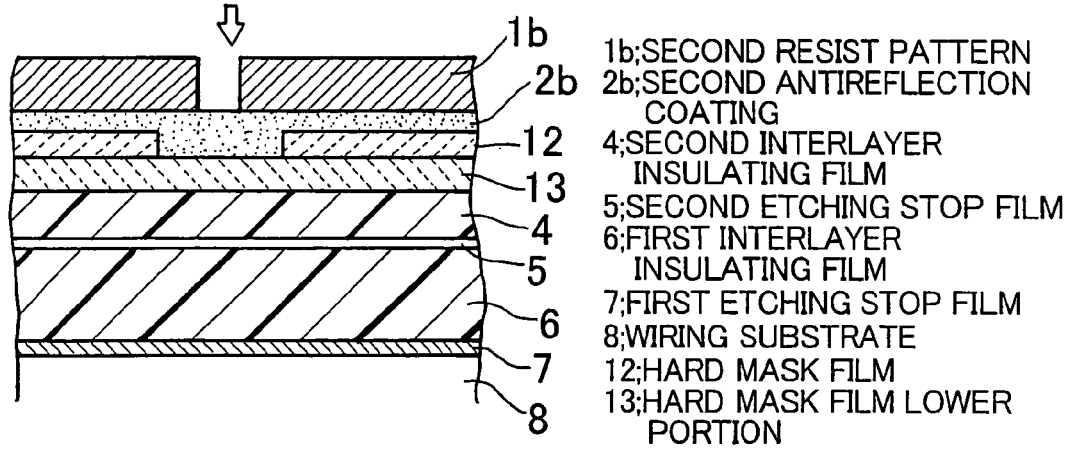

- 1b; SECOND RESIST PATTERN
- 2b; SECOND ANTIREFLECTION COATING
- 4; SECOND INTERLAYER INSULATING FILM
- 5; SECOND ETCHING STOP FILM
- 6; FIRST INTERLAYER INSULATING FILM
- 7; FIRST ETCHING STOP FILM
- 8; WIRING SUBSTRATE
- 12; HARD MASK FILM
- 13; HARD MASK FILM LOWER PORTION

FIG. 15A

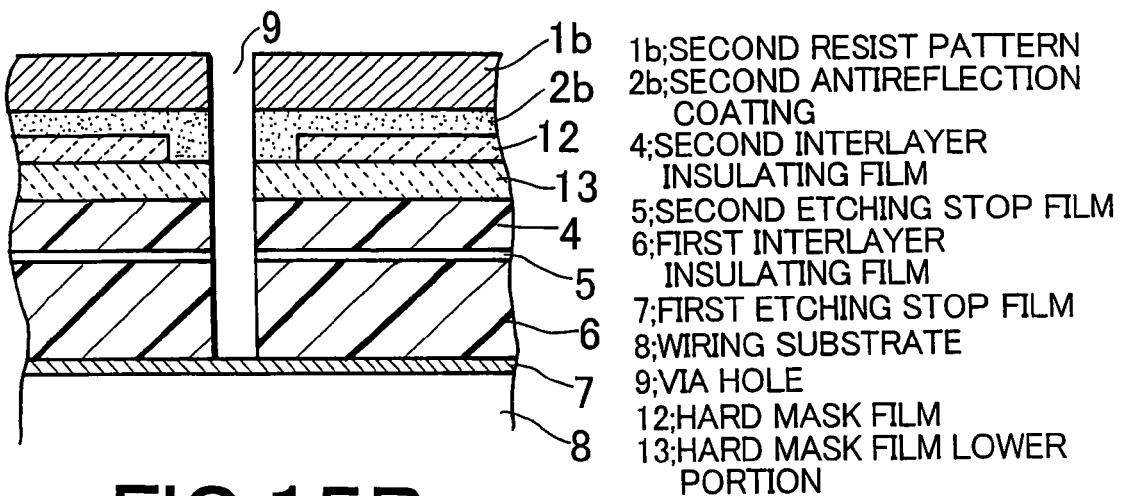

- 1b; SECOND RESIST PATTERN
- 2b; SECOND ANTIREFLECTION COATING
- 4; SECOND INTERLAYER INSULATING FILM
- 5; SECOND ETCHING STOP FILM
- 6; FIRST INTERLAYER INSULATING FILM
- 7; FIRST ETCHING STOP FILM
- 8; WIRING SUBSTRATE
- 9; VIA HOLE
- 12; HARD MASK FILM
- 13; HARD MASK FILM LOWER PORTION

FIG. 15B

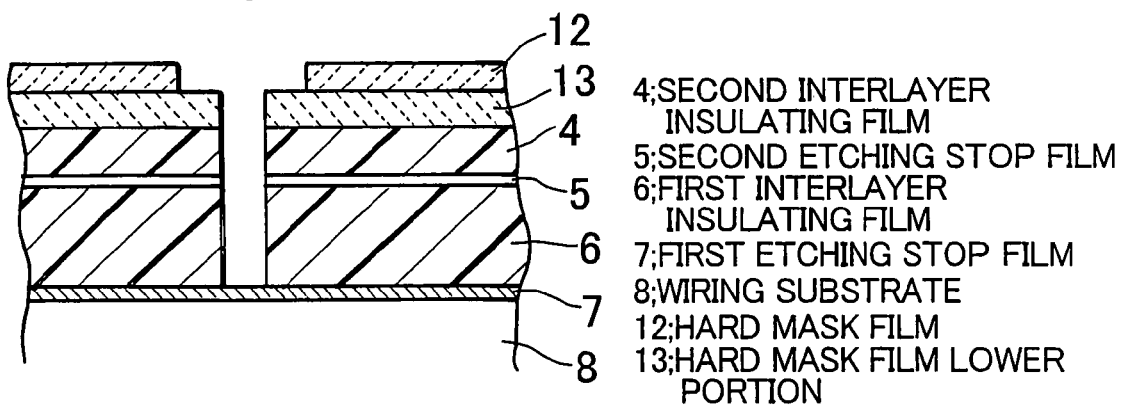

- 4; SECOND INTERLAYER INSULATING FILM
- 5; SECOND ETCHING STOP FILM
- 6; FIRST INTERLAYER INSULATING FILM
- 7; FIRST ETCHING STOP FILM
- 8; WIRING SUBSTRATE
- 12; HARD MASK FILM
- 13; HARD MASK FILM LOWER PORTION

FIG. 15C

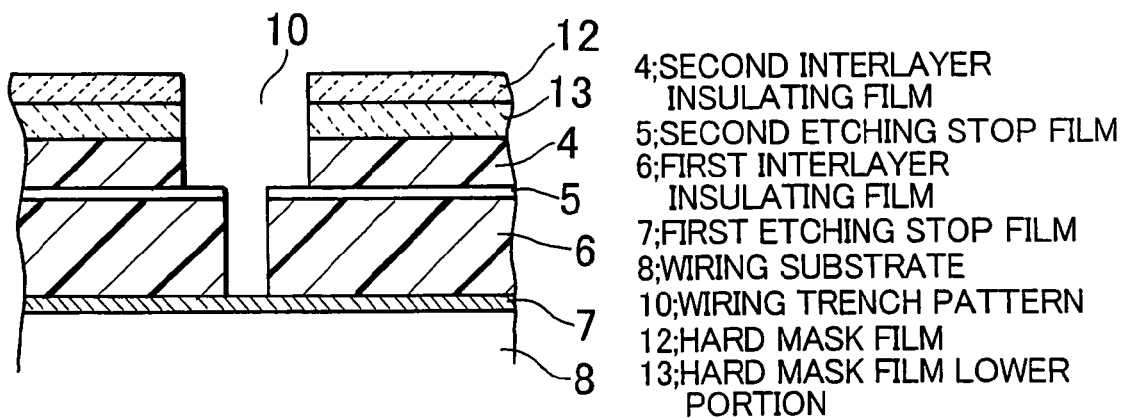

- 4; SECOND INTERLAYER INSULATING FILM
- 5; SECOND ETCHING STOP FILM
- 6; FIRST INTERLAYER INSULATING FILM
- 7; FIRST ETCHING STOP FILM
- 8; WIRING SUBSTRATE
- 10; WIRING TRENCH PATTERN
- 12; HARD MASK FILM
- 13; HARD MASK FILM LOWER PORTION

4;SECOND INTERLAYER
  INSULATING FILM
5;SECOND ETCHING STOP FILM
6;FIRST INTERLAYER
  INSULATING FILM
7;FIRST ETCHING STOP FILM
8;WIRING SUBSTRATE
11;WIRING MATERIAL
12;HARD MASK FILM
13;HARD MASK FILM LOWER
   PORTION

FIG. 17A

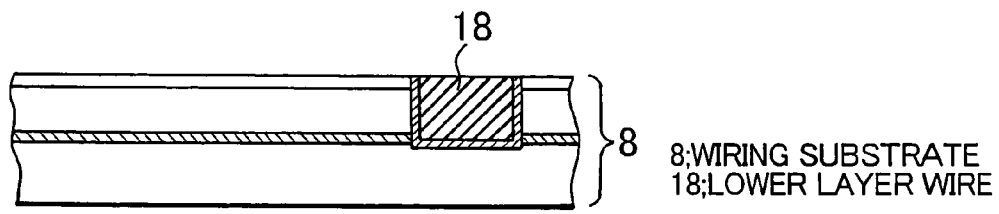

8: WIRING SUBSTRATE
18: LOWER LAYER WIRE

FIG. 17B

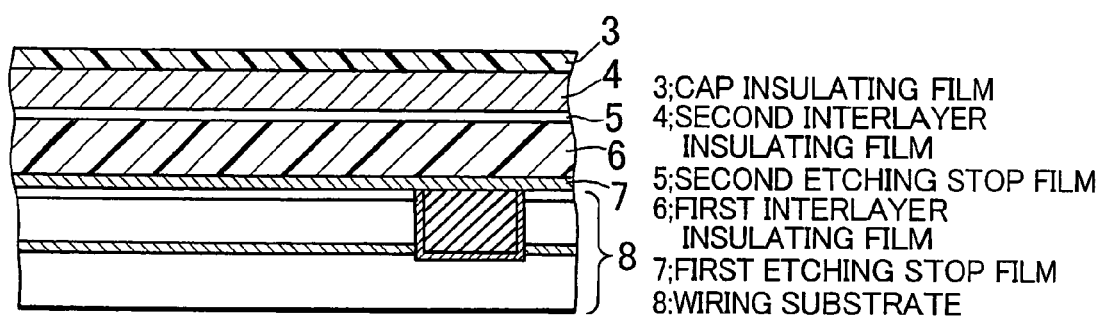

3: CAP INSULATING FILM
4: SECOND INTERLAYER INSULATING FILM
5: SECOND ETCHING STOP FILM
6: FIRST INTERLAYER INSULATING FILM
7: FIRST ETCHING STOP FILM
8: WIRING SUBSTRATE

FIG. 17C

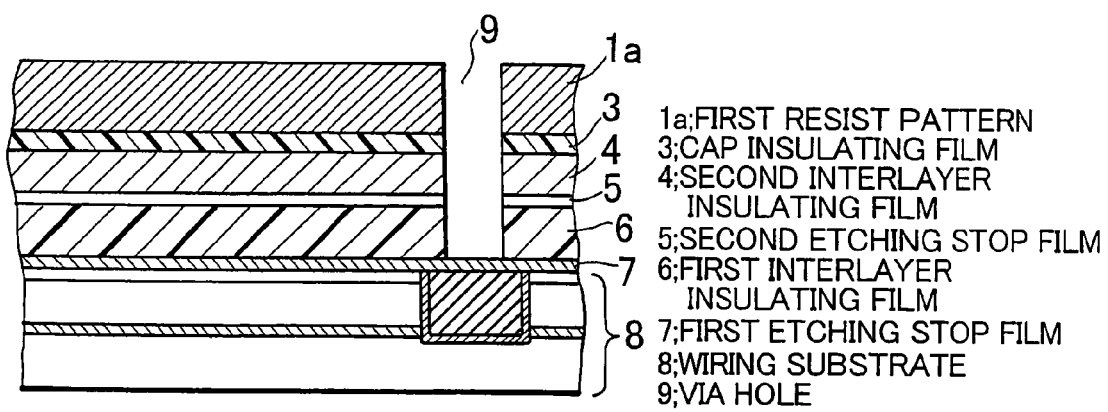

1a: FIRST RESIST PATTERN
3: CAP INSULATING FILM
4: SECOND INTERLAYER INSULATING FILM
5: SECOND ETCHING STOP FILM
6: FIRST INTERLAYER INSULATING FILM
7: FIRST ETCHING STOP FILM
8: WIRING SUBSTRATE
9: VIA HOLE

FIG.18A

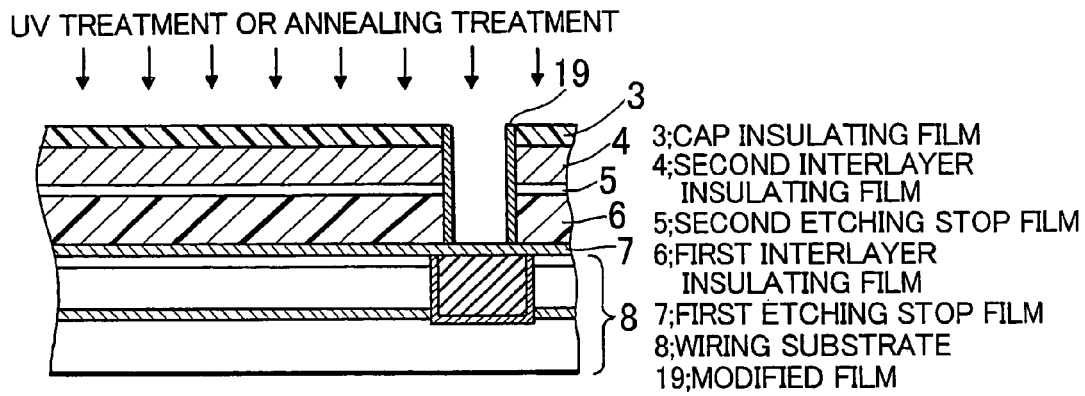

UV TREATMENT OR ANNEALING TREATMENT

3; CAP INSULATING FILM
4; SECOND INTERLAYER INSULATING FILM
5; SECOND ETCHING STOP FILM
6; FIRST INTERLAYER INSULATING FILM
7; FIRST ETCHING STOP FILM
8; WIRING SUBSTRATE
19; MODIFIED FILM

FIG.18B

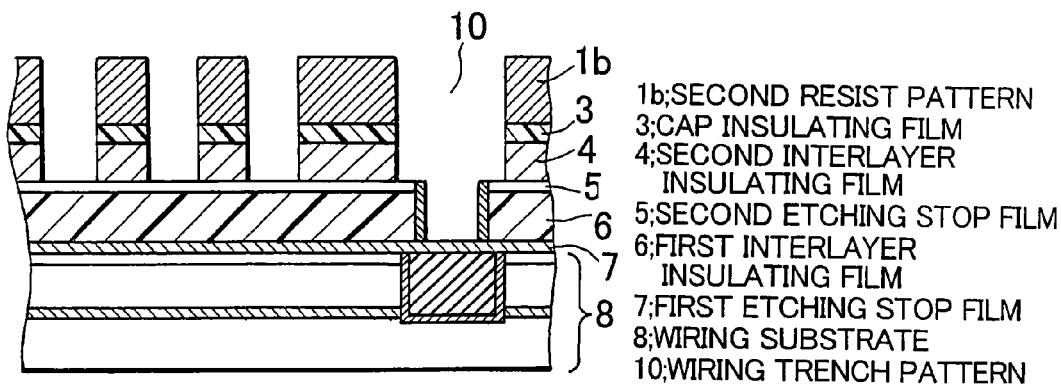

1b; SECOND RESIST PATTERN
3; CAP INSULATING FILM
4; SECOND INTERLAYER INSULATING FILM
5; SECOND ETCHING STOP FILM
6; FIRST INTERLAYER INSULATING FILM
7; FIRST ETCHING STOP FILM
8; WIRING SUBSTRATE
10; WIRING TRENCH PATTERN

FIG.18C

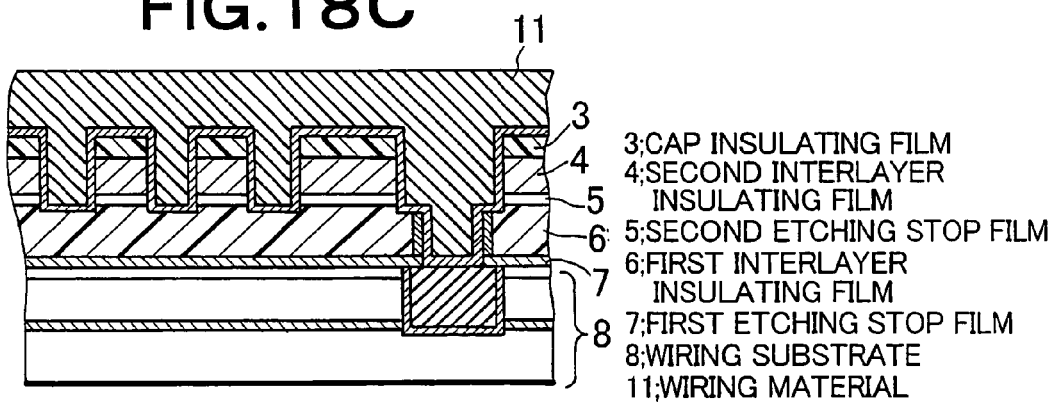

3; CAP INSULATING FILM
4; SECOND INTERLAYER INSULATING FILM
5; SECOND ETCHING STOP FILM
6; FIRST INTERLAYER INSULATING FILM
7; FIRST ETCHING STOP FILM
8; WIRING SUBSTRATE
11; WIRING MATERIAL

3; CAP INSULATING FILM
4; SECOND INTERLAYER INSULATING FILM
5; SECOND ETCHING STOP FILM
6; FIRST INTERLAYER INSULATING FILM
7; FIRST ETCHING STOP FILM
8; WIRING SUBSTRATE
11; WIRING MATERIAL
19; MODIFIED FILM

FIG.20A

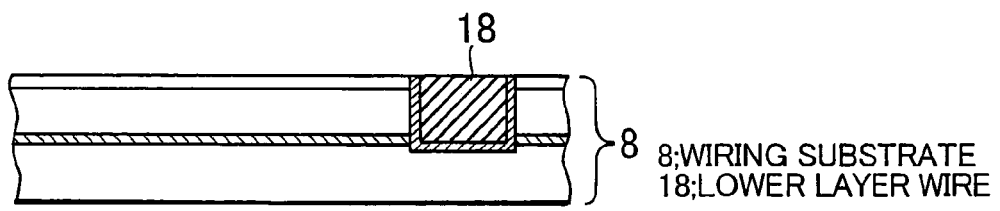

8; WIRING SUBSTRATE
18; LOWER LAYER WIRE

FIG.20B

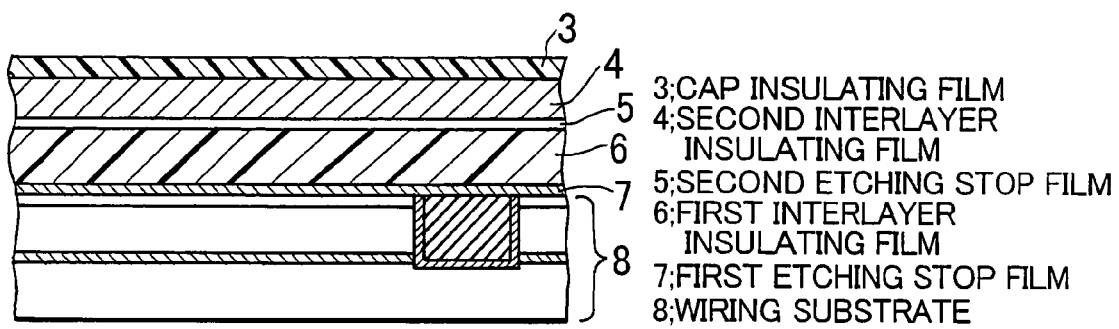

3; CAP INSULATING FILM
4; SECOND INTERLAYER INSULATING FILM
5; SECOND ETCHING STOP FILM
6; FIRST INTERLAYER INSULATING FILM
7; FIRST ETCHING STOP FILM
8; WIRING SUBSTRATE

FIG.20C

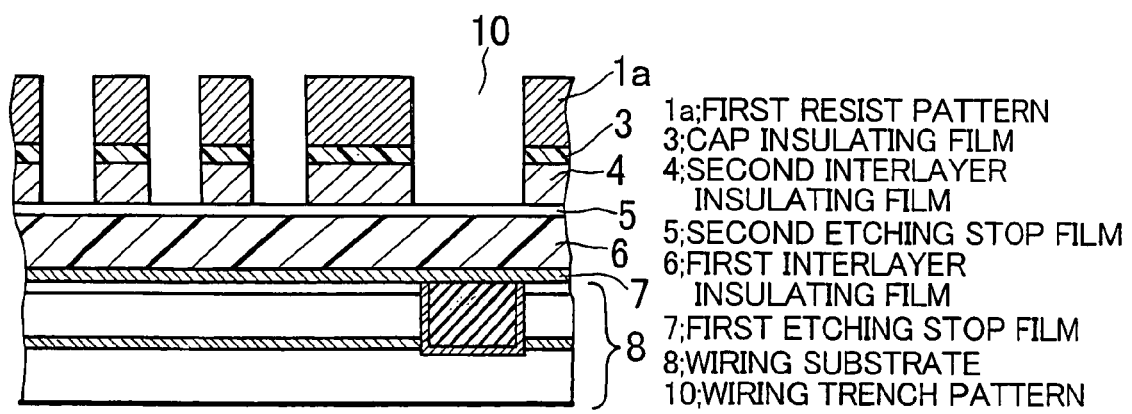

1a; FIRST RESIST PATTERN
3; CAP INSULATING FILM
4; SECOND INTERLAYER INSULATING FILM
5; SECOND ETCHING STOP FILM
6; FIRST INTERLAYER INSULATING FILM
7; FIRST ETCHING STOP FILM
8; WIRING SUBSTRATE
10; WIRING TRENCH PATTERN

FIG.21A

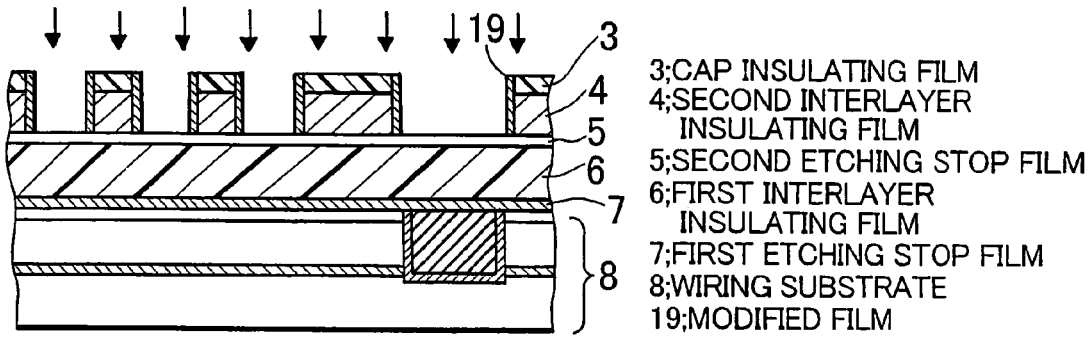

3;CAP INSULATING FILM
4;SECOND INTERLAYER INSULATING FILM
5;SECOND ETCHING STOP FILM
6;FIRST INTERLAYER INSULATING FILM
7;FIRST ETCHING STOP FILM
8;WIRING SUBSTRATE
19;MODIFIED FILM

FIG.21B

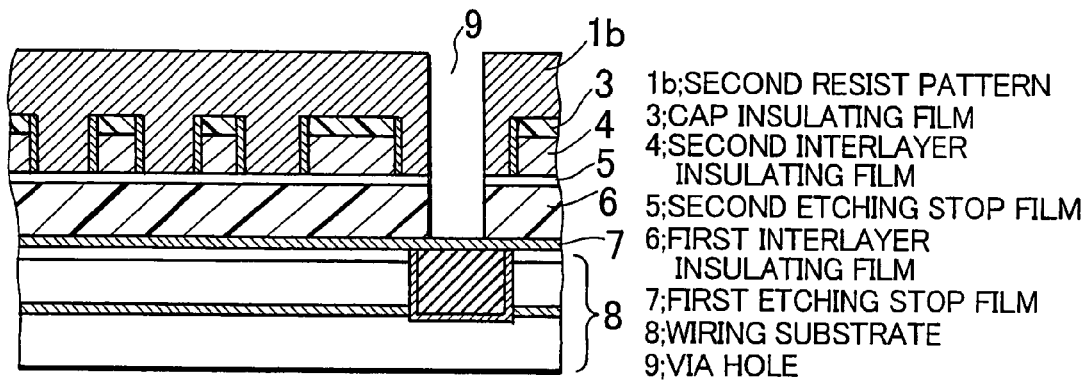

1b;SECOND RESIST PATTERN
3;CAP INSULATING FILM
4;SECOND INTERLAYER INSULATING FILM
5;SECOND ETCHING STOP FILM
6;FIRST INTERLAYER INSULATING FILM
7;FIRST ETCHING STOP FILM
8;WIRING SUBSTRATE
9;VIA HOLE

FIG.21C

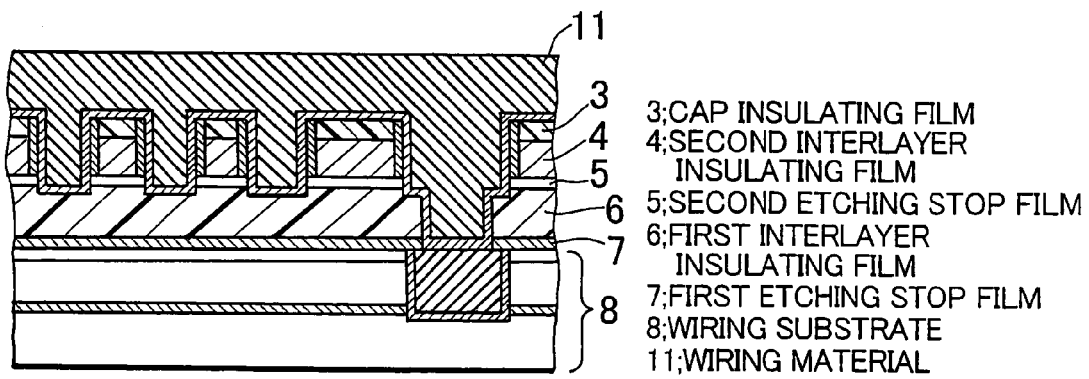

3;CAP INSULATING FILM
4;SECOND INTERLAYER INSULATING FILM
5;SECOND ETCHING STOP FILM
6;FIRST INTERLAYER INSULATING FILM
7;FIRST ETCHING STOP FILM
8;WIRING SUBSTRATE
11;WIRING MATERIAL

3; CAP INSULATING FILM
4; SECOND INTERLAYER
   INSULATING FILM
5; SECOND ETCHING STOP FILM
6; FIRST INTERLAYER
   INSULATING FILM
7; FIRST ETCHING STOP FILM
8; WIRING SUBSTRATE
11; WIRING MATERIAL
19; MODIFIED FILM

FIG.23A

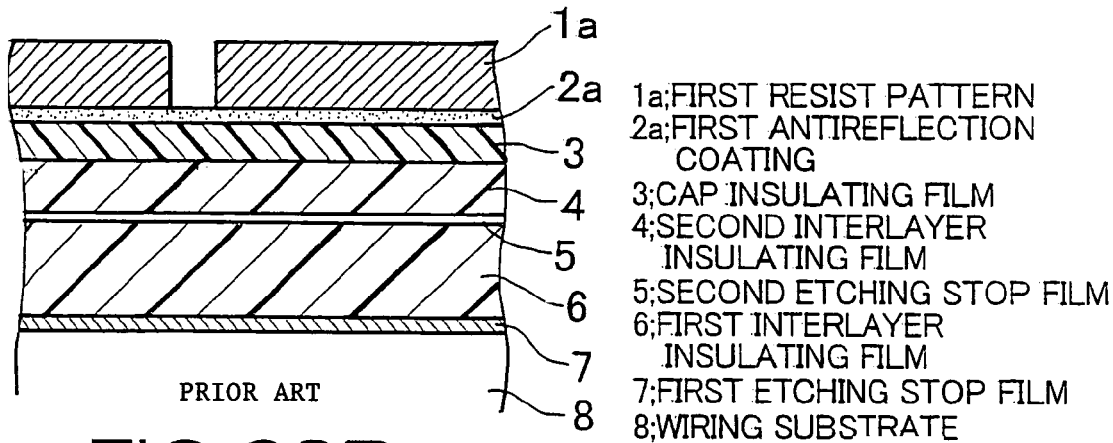

PRIOR ART

1a: FIRST RESIST PATTERN
2a: FIRST ANTIREFLECTION COATING
3: CAP INSULATING FILM
4: SECOND INTERLAYER INSULATING FILM
5: SECOND ETCHING STOP FILM
6: FIRST INTERLAYER INSULATING FILM
7: FIRST ETCHING STOP FILM
8: WIRING SUBSTRATE

FIG.23B

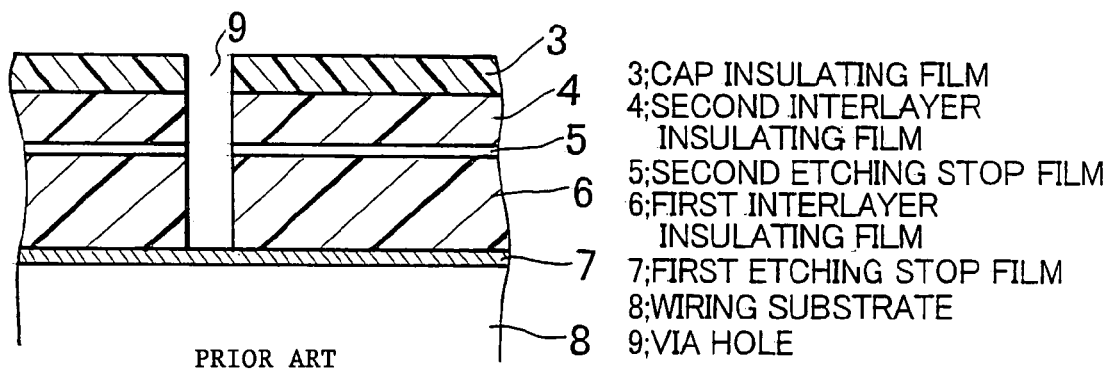

PRIOR ART

3: CAP INSULATING FILM
4: SECOND INTERLAYER INSULATING FILM
5: SECOND ETCHING STOP FILM
6: FIRST INTERLAYER INSULATING FILM
7: FIRST ETCHING STOP FILM
8: WIRING SUBSTRATE
9: VIA HOLE

FIG.23C

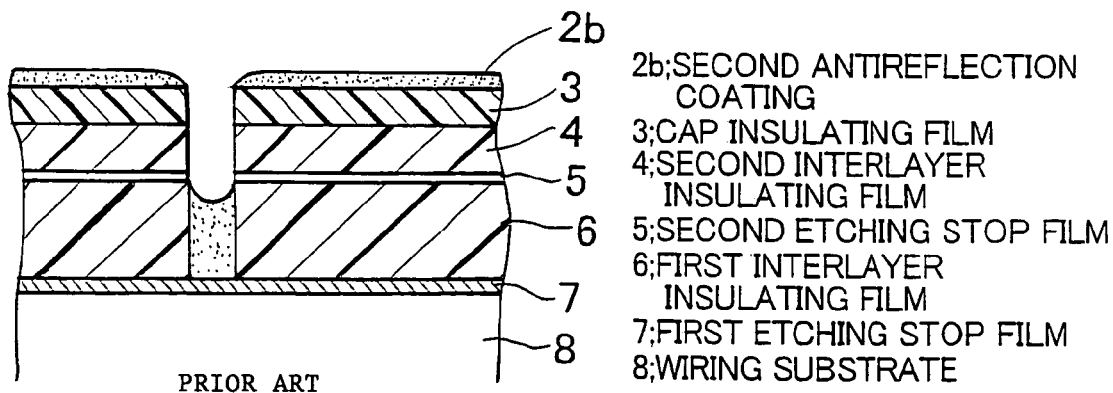

PRIOR ART

2b: SECOND ANTIREFLECTION COATING
3: CAP INSULATING FILM
4: SECOND INTERLAYER INSULATING FILM
5: SECOND ETCHING STOP FILM
6: FIRST INTERLAYER INSULATING FILM
7: FIRST ETCHING STOP FILM
8: WIRING SUBSTRATE

FIG.24A

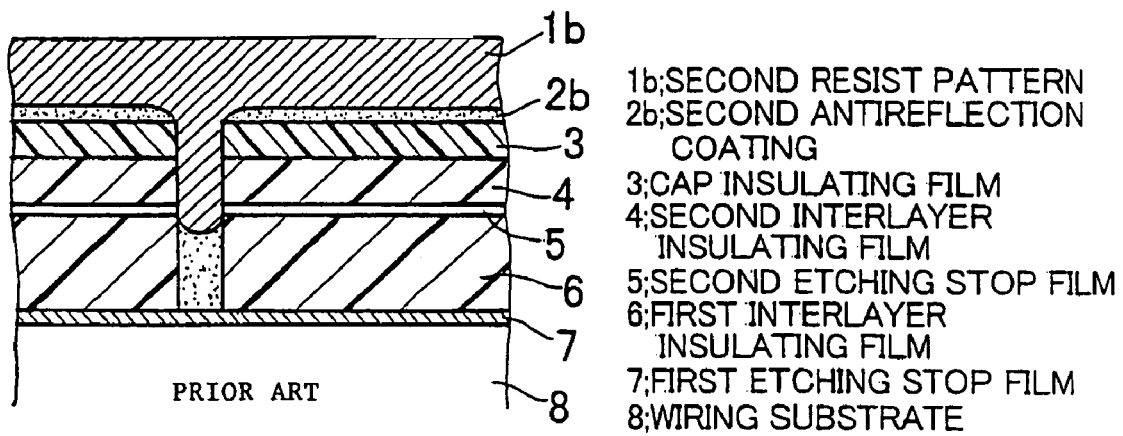

PRIOR ART

1b;SECOND RESIST PATTERN
2b;SECOND ANTIREFLECTION COATING
3;CAP INSULATING FILM
4;SECOND INTERLAYER INSULATING FILM
5;SECOND ETCHING STOP FILM
6;FIRST INTERLAYER INSULATING FILM
7;FIRST ETCHING STOP FILM
8;WIRING SUBSTRATE

FIG.24B

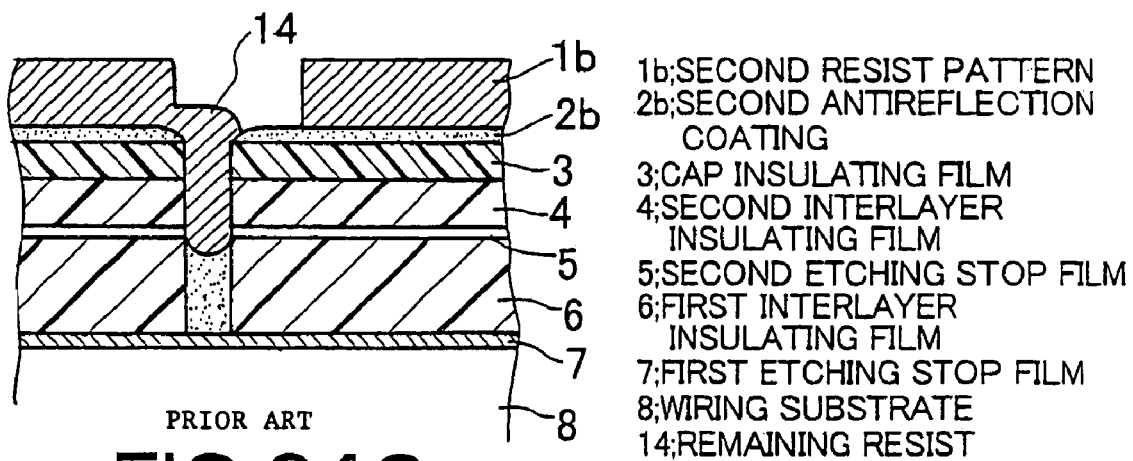

PRIOR ART

1b;SECOND RESIST PATTERN
2b;SECOND ANTIREFLECTION COATING
3;CAP INSULATING FILM
4;SECOND INTERLAYER INSULATING FILM
5;SECOND ETCHING STOP FILM
6;FIRST INTERLAYER INSULATING FILM
7;FIRST ETCHING STOP FILM
8;WIRING SUBSTRATE
14;REMAINING RESIST

FIG.24C

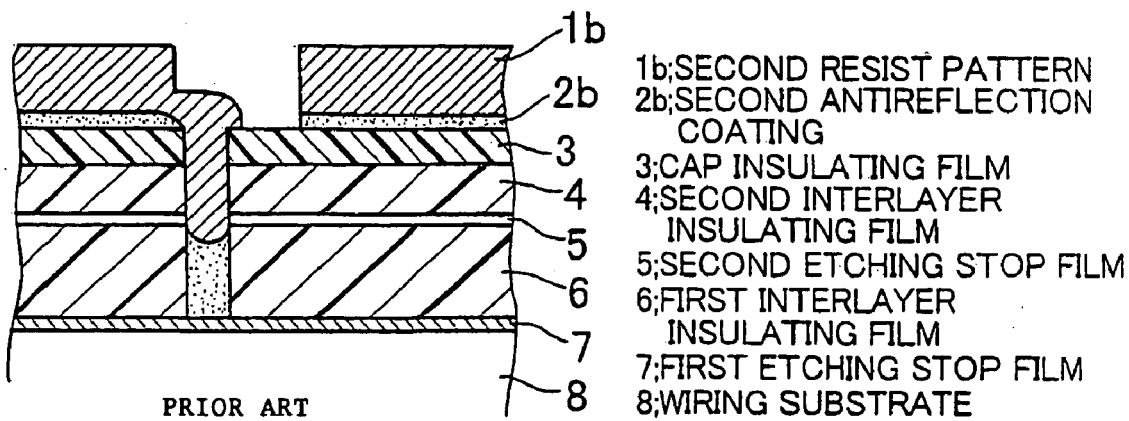

PRIOR ART

1b;SECOND RESIST PATTERN
2b;SECOND ANTIREFLECTION COATING
3;CAP INSULATING FILM
4;SECOND INTERLAYER INSULATING FILM
5;SECOND ETCHING STOP FILM
6;FIRST INTERLAYER INSULATING FILM
7;FIRST ETCHING STOP FILM
8;WIRING SUBSTRATE

FIG.25A

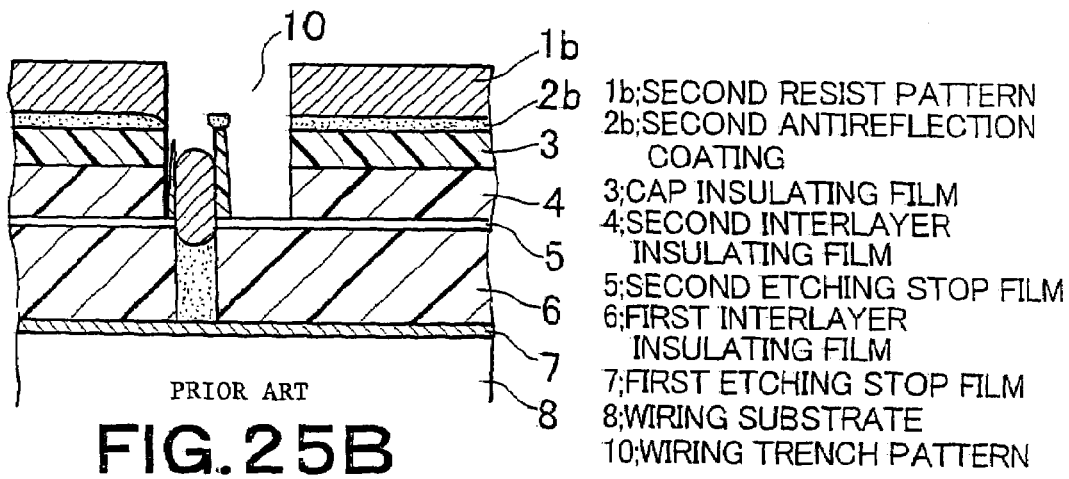

PRIOR ART

1b; SECOND RESIST PATTERN
2b; SECOND ANTIREFLECTION COATING
3; CAP INSULATING FILM
4; SECOND INTERLAYER INSULATING FILM
5; SECOND ETCHING STOP FILM
6; FIRST INTERLAYER INSULATING FILM
7; FIRST ETCHING STOP FILM
8; WIRING SUBSTRATE
10; WIRING TRENCH PATTERN

FIG.25B

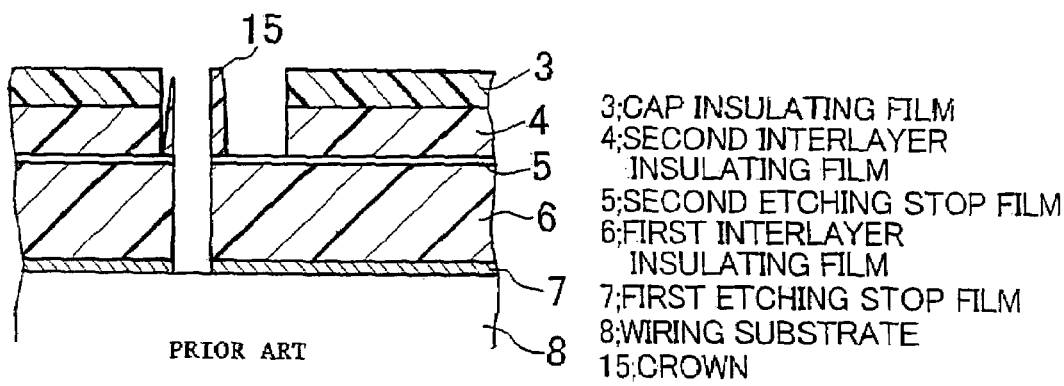

PRIOR ART

3; CAP INSULATING FILM
4; SECOND INTERLAYER INSULATING FILM
5; SECOND ETCHING STOP FILM
6; FIRST INTERLAYER INSULATING FILM
7; FIRST ETCHING STOP FILM
8; WIRING SUBSTRATE
15; CROWN

FIG.25C

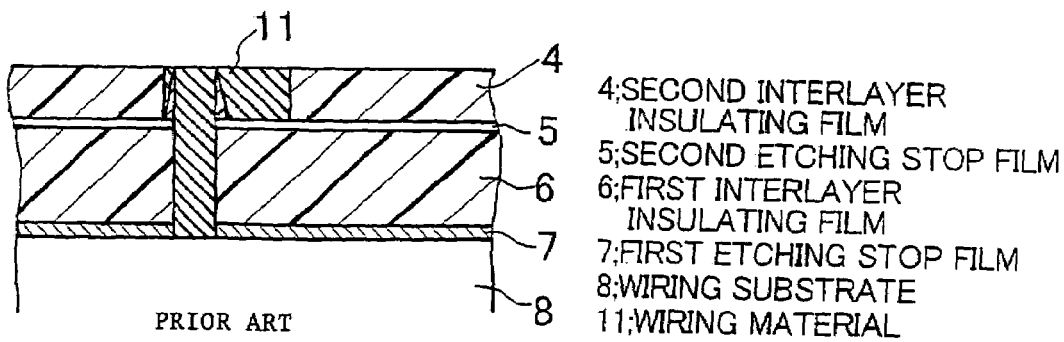

PRIOR ART

4; SECOND INTERLAYER INSULATING FILM
5; SECOND ETCHING STOP FILM
6; FIRST INTERLAYER INSULATING FILM
7; FIRST ETCHING STOP FILM
8; WIRING SUBSTRATE
11; WIRING MATERIAL

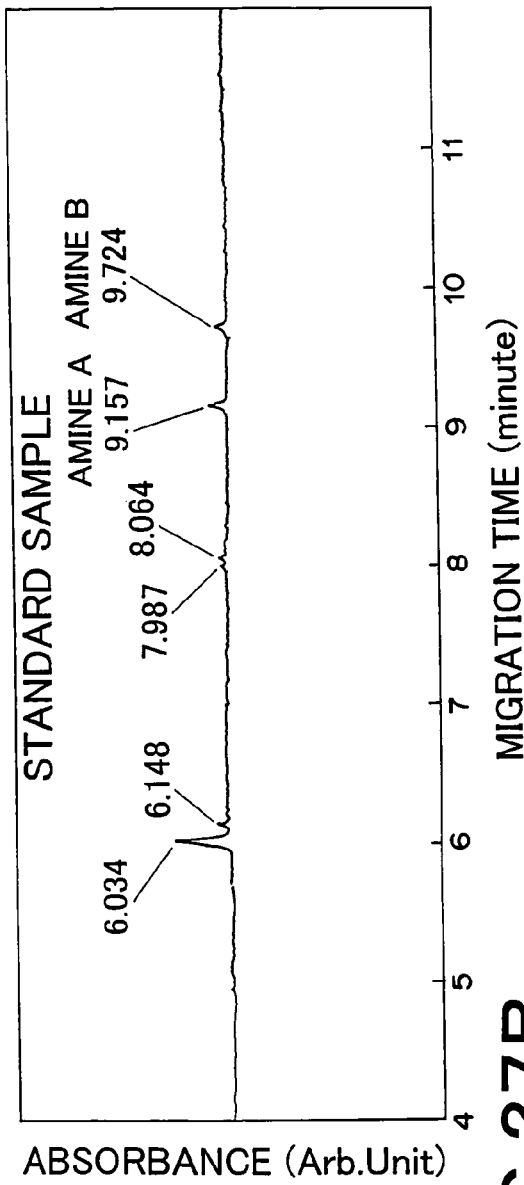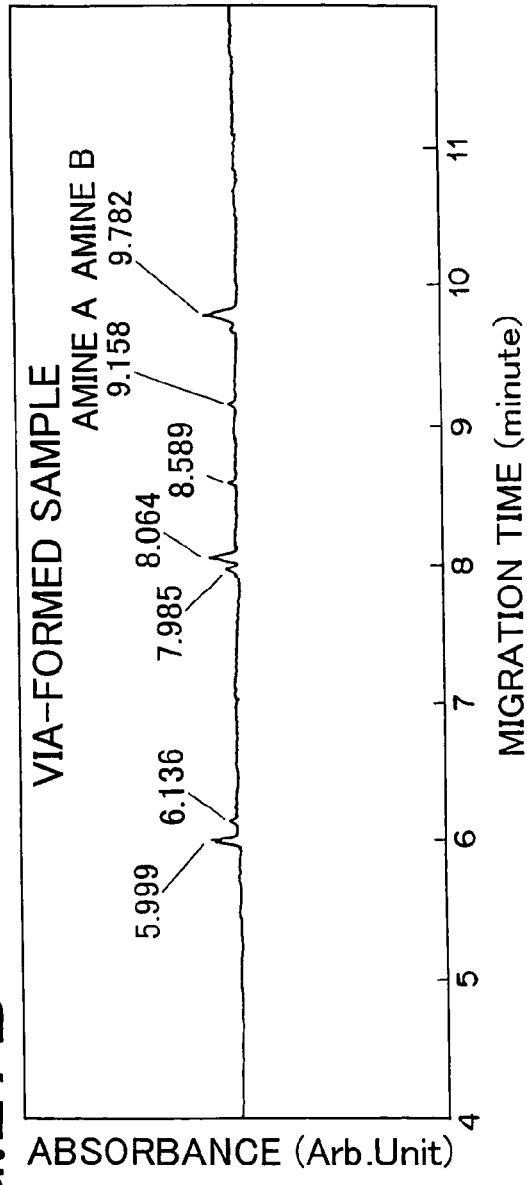

FIG.28
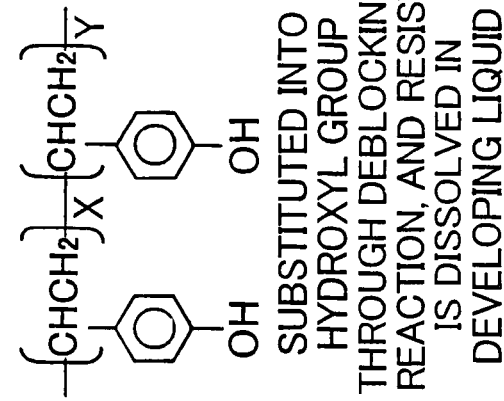
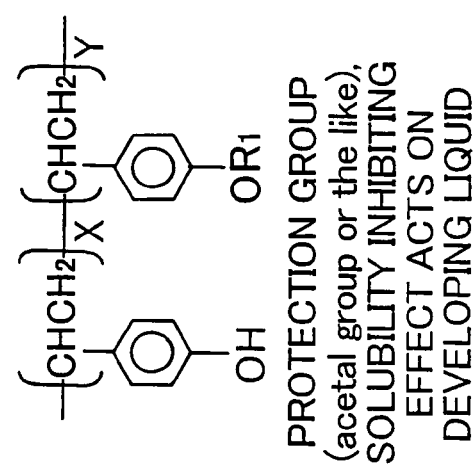

SEMICONDUCTOR DEVICE AND METHOD OF MANUFACTURING THE SAME

This application is a division of co-pending application Ser. No. 10/303,715, filed on Nov. 26, 2002, the entire contents of which are hereby incorporated by reference.

BACKGROUND OF THE INVENTION

1. Field of the Invention

The present invention relates to a semiconductor device and a method of manufacturing the same, and particularly to a semiconductor device having a damascene structure and a method of manufacturing the same.

2. Description of the Related Art

In connection with enhancement in the integration of semiconductor devices and reduction in chip size, miniaturization of wires and multi-layered wiring have been recently promoted. As a method of forming a multi-layered wiring structure is generally carried out a so-called damascene process in which Cu is embedded into via holes and wiring trench patterns at the same time and then surface flattening is carried out by using CMP (Chemical Mechanical Polishing) method to form wires. With the damascene process described above, the density of the wiring pattern can be increased, however, a wiring delay problem would occur due to the parasitic capacity between wiring patterns if the wiring patterns are close to each other. Therefore, it is an important object to reduce the wiring capacity for an improvement in wiring delay.

As a method to reduce the wiring capacity is considered a method of using material having a lower dielectric constant as an interlayer insulating film in place of a $SiO_2$-based insulating film which has been hitherto used (See JP(A)-2000-77409, etc.). Here, a conventional damascene process using low dielectric constant film as an interlayer insulating film will be described with reference to the accompanying drawings. FIGS. 23A to 25C are cross-sectional views showing a via-first process corresponding to one type of conventional damascene process.

First, as shown in FIG. 23A, a first etching stop film 7 preventing diffusion of Cu and serving as an etching stopper for via holes, a first interlayer insulating film 6 of $SiO_2$, a second etching stop film 5 serving as an etching stopper for wire trench patterns, a second interlayer insulating film 4 serving as a low dielectric constant film and a cap insulating film 3 of $SiO_2$ are successively deposited on a wire substrate 8 on which a lower layer wire of Cu or the like is formed by a well-known method. Further, a first antireflection coating (ARC: Anti Reflection Coating) 2a and a photoresist are successively coated, and then subjected to light-exposure and development treatments to form a first resist pattern 1a for formation of the via holes 9.

Subsequently, as shown in FIG. 23B, the first antireflection coating 2a, the cap insulating film 3, the second interlayer insulating film 4, the second etching stop film 5 and the first interlayer insulating film 6 are successively etched with the first resist pattern 1a being used as a mask by using a well-known dry etching technique to form a via hole 9 penetrating through these films. Thereafter, by carrying out an oxygen plasma ashing treatment and a wet treatment using organic peeling liquid, the first resist pattern 1a and the first antireflection coating 2a are peeled off stripped off or removed and the residual materials of the dry etching are removed.

After the wet treatment using the organic peeling liquid, as shown in FIGS. 23C and 24A, a second antireflection coating 2b and a photoresist are successively coated, and then subjected to light-exposure and development treatments to form a second resist pattern 1b through which the wire trench patterns are etched (see FIG. 24B). Thereafter, by using a well-known dry etching technique, the second antireflection coating 2b, the cap insulating film 3 and the second interlayer insulating film 4 are successively etched to form wire trench patterns 10. Thereafter, by using the oxygen plasma ashing and the wet treatment using the organic peeling liquid, the second resist pattern 1b and the second antireflection film 2b are peeled off, and the residual materials of the dry etching are removed (see FIGS. 24C, 25A, 25B). A wiring material 11 of Cu or the like is embedded in the wire trench patterns 10 and the via holes 9 and the surface thereof is flattened by the CMP method to form a dual damascene structure.

Reference is made to the description at pages 5 to 7 and FIG. 1 of the above JP(A)-2000-77409.

As described above, according to the via-first dual damascene process, the via holes 9 are formed by using the first resist pattern 1a, and after the first resist pattern 1a is peeled off, the second resist pattern 1b for etching the wire trench patterns 10 is subsequently formed. However, in the conventional method, after the wet peeling process using the basic organic peeling liquid for peeling the first resist pattern 1a and the first antireflection coating 2a and before the coating of the second antireflection coating 2b or the resist, no pre-treatment is carried out, or dehydrating bake (for about 2 minutes at a temperature of about 150° C. to 250° C.) or thinner pre-wetting is merely carried out as a pre-treatment by a coating machine.

The dehydrating bake and the thinner pre-wetting treatments aim to remove water adsorbed on the substrate, particularly the inner wall of the via holes 9, and they do not aim to remove materials disturbing the chemical reactions in the resist such as basic materials, etc. (hereinafter referred to as reaction inhibiting materials). Therefore, there is a problem that the resolution of the second resist pattern 1b is lowered by the reaction inhibiting materials. That is, the chemical reactions are promoted by using acid catalyst occurring in the resist through the light exposure so that the resist is partially made to be easily dissoluble by developing liquid, thereby forming a resist pattern. However, the reaction inhibiting materials infiltrating into the interlayer insulating film exudes into the resist to deactivate the acid catalyst and thus suppress the chemical reactions in the resist, so that the resist at a part of the wire trench patterns 10, particularly the resist in the neighborhood of the via holes 9 is not sufficiently removed and thus remains there.

If the wiring trench patterns are subsequently etched under the state that the resist remains at the portion to be originally removed, the wire trench patterns 10 get out of shape, or particularly when a large part of the resist remains as shown in FIG. 24B, etching residue called as crown 15 as shown in FIG. 25A remains around the via holes 9. The crown 15 is not dissolved in the organic peeling liquid, and thus it remains until the wiring material 11 is embedded. Therefore, there occurs a problem that reliability of the completed wires is reduced.

This problem also occurs when $SiO_2$ is used for the interlayer insulating film, and it occurs more remarkably when a low dielectric constant film is used for the interlayer insulating film. Since the low dielectric constant film is generally formed of coarse film, it is designed so that chemical solution such as organic peeling liquid, cleaning liquid, etc. is liable to infiltrate into the inside of the film and floating substances in air are liable to adhere to the film.

Therefore, when antireflection coating or resist coated on the film concerned is baked, reaction inhibiting materials contained in the chemical solution exude gradually from the film concerned into the resist.

It is also known that, in addition to the chemical solution such as organic peeling liquid, cleaning liquid, etc., specific elements in the interlayer insulating film function as the reaction inhibiting materials. Therefore, if formation of the resist pattern is performed under such a condition that the interlayer insulating film or the etching stop film is exposed to the inner wall of the via-hole or the wiring trench pattern formed therein, the same problem as mentioned in the above occurs.

This problem occurs not only in the via-first dual damascene process, but also in other damascene processes such as a dual hard mask process, trench-first dual damascene process, etc. or in another semiconductor process having a step of forming a next resist pattern after a wet treatment using organic peeling liquid, cleaning liquid or the like or forming a resist pattern under such a condition that the insulating film is exposed to the inner wall of the via-hole or the trench pattern.

SUMMARY OF THE INVENTION

The present invention has been implemented in view of the foregoing problem, and has an object to provide a method of manufacturing a semiconductor device, which can surely remove reaction inhibiting materials inducing resolution failure of a resist pattern, suppress adhesion of the reaction inhibiting materials in air or suppress the influence of the reaction inhibiting materials in the interlayer insulating film, particularly to provide a semiconductor device formed by using the damascene process and method of manufacturing the same.

In order to attain the above object, according to the present invention, there is provided a semiconductor device manufacturing method comprising a step of conducting a wet treatment using organic peeling or stripping or removing liquid or cleaning liquid on a substrate having an insulating film formed thereon and then forming a resist pattern on the insulating film, characterized in that before a resist serving as the resist pattern or antireflection coating provided between the insulating film and the resist is coated subsequently to the wet treatment, a pre-treatment for removing reaction inhibiting materials which are contained in the organic peeling or stripping or removing liquid or the cleaning liquid and inhibit the chemical reaction of the resist is conducted.

According to the present invention, there is also provided a semiconductor device manufacturing method comprising: at least a step of successively depositing at least a first interlayer insulating film and a second interlayer insulating film on a substrate on which a wiring pattern is formed; a step of forming a first resist pattern on the second interlayer insulating film and forming via holes by dry etching using the first resist pattern as a mask so that the via holes penetrate through the first interlayer insulating film and the second interlayer insulating film; a step of conducting at least one wet treatment of a treatment of removing etching residual materials with organic peeling liquid and a treatment of cleaning with cleaning liquid; a step of forming a second resist pattern on the second interlayer insulating film; a step of etching the second interlayer insulating film by using the second resist pattern as a mask to form wiring trench patterns; and a step of embedding wiring material in the via holes and the wiring trench patterns and polishing the surface of the wiring material thus embedded to thereby form a wiring pattern, characterized in that before a resist serving as the second resist pattern or antireflection coating provided between the second insulating film and the resist is coated subsequently to the wet treatment, a pre-treatment for removing reaction inhibiting materials which are contained in the organic peeling liquid or the cleaning liquid and inhibit the chemical reaction of the resist is conducted.

According to the present invention, there is also provided a semiconductor device manufacturing method comprising: at least a step of depositing at least a first interlayer insulating film, a second interlayer insulating film and a mask member formed of inorganic material; a step of forming a first resist pattern on the mask member and etching the mask member by using the first resist pattern to form a hard mask; a step of conducting at least one wet treatment of a treatment for removing etching residual materials with organic peeling liquid and a treatment for cleaning with cleaning liquid; a step of forming a second resist pattern on the hard mask; a step of forming via holes by using dry etching using the second resist pattern as a mask so that the via holes penetrate through the first interlayer insulating film and the second interlayer insulating film; a step of etching the second interlayer insulating film by using the hard mask to form wiring trench patterns after the second resist pattern is removed; and a step of embedding wire material into the via holes and the wiring trench patterns and polishing the surface of the wiring material to form a wiring pattern, characterized in that before a resist serving as the second resist pattern or antireflection coating provided between the second insulating film and the resist is coated subsequently to the wet treatment, a pre-treatment for removing reaction inhibiting materials which are contained in the organic peeling liquid or the cleaning liquid and inhibit the chemical reaction of the resist is conducted.

In the present invention, the insulating film or at least one of the first interlayer insulating film and the second interlayer insulating film may be formed of a low dielectric-constant film.

In the present invention, the reaction inhibiting materials may comprise basic materials so that catalysis action of acid occurring in the resist due to light exposure is inhibited by the basic materials, and the basic materials preferably contain amine.

In the present invention, it is preferable that at least one of an annealing treatment, a UV treatment, a plasma treatment and an organic solvent treatment is carried out as the pre-treatment, and as the pre-treatment is carried out the UV treatment after the annealing treatment.

In the present invention, the annealing treatment may comprise a treatment for conducting annealing at a predetermined temperature to eliminate the reaction inhibiting materials infiltrated into or adsorbed to the insulating film, the first interlayer insulating film or the second interlayer insulating film, the UV treatment may comprise a treatment for neutralizing the reaction inhibiting materials infiltrated into or adsorbed to the insulating film, the first interlayer insulating film or the second interlayer insulating film with oxygen or ozone activated by irradiation of UV light, and the plasma treatment may comprise a treatment for etching the reaction inhibiting materials infiltrated into or adsorbed to the insulating film, the first interlayer insulating film or the second interlayer insulating film with plasma containing at least one of oxygen, nitrogen and ammonia.

In the present invention, it is preferable that the organic solvent treatment uses organic solvent containing any one of polypyreneglycol monomethyl ether acetate, polypyreneglycol monomethyl ether, ethyl lactate, cyclohexanone and methyl ethyl ketone.

In the present invention, the organic solvent may contain acidic material so that the reaction inhibiting materials infiltrated into or adsorbed to the insulating film, the first interlayer insulating film or the second interlayer insulating film are neutralized by the acidic material, or, the organic solvent may contain weakly basic material so that the reaction inhibiting materials infiltrated into or adsorbed to the insulating film, the first interlayer insulating film or the second interlayer insulating film are substituted into the weakly basic materials.

According to the present invention, there is provided a semiconductor device manufactured by the above methods, wherein at least one of an annealing treatment and a UV treatment is used as the pre-treatment, and the device comprises the wiring pattern formed in the via holes or the wiring trench patterns and having a side wall, and the insulating film having a face layer portion contacting at least a portion of the side wall of the wring pattern and an inner portion other than the face layer portion, the face layer portion having a composition ratio or density which is different from that of the inner portion.

According to the present invention, there is provided a semiconductor device having a dual damascene wiring structure, comprising at least one of a via and a wire made of conductive material having a side wall, and an interlayer insulating film having a face layer portion contacting at least a portion of the side wall of the via or the wire and an inner portion other than the face layer portion, wherein the interlayer insulating film contains Si and O as a predominant element and the face layer portion is lower in nitrogen concentration than the inner portion, or the interlayer insulating film has a low dielectric constant and contains Si, O and H as a predominant element and the face layer portion is higher in oxygen concentration and lower in hydrogen concentration than the inner portion, or the interlayer insulating film has a low dielectric constant and contains Si, O, C and H as a predominant element and the face layer portion is higher in oxygen concentration and lower in carbon and hydrogen concentrations than the inner portion.

According to the present invention, there is provided a semiconductor device having a dual damascene wiring structure, comprising at least one of a via and a wire made of conductive material having a side wall, and a barrier film or an etching stop film having a face layer portion contacting at least a portion of the side wall of the via or the wire and an inner portion other than the face layer portion, wherein the barrier film or the etching stop film contains Si, C, N and H as a predominant element and the face layer portion is higher in oxygen concentration and lower in carbon, nitrogen and hydrogen concentrations than the inner portion, or the barrier film or the etching stop film contains Si, C and H as a predominant element and the face layer portion is higher in oxygen concentration and lower in carbon and hydrogen concentrations than the inner portion.

According to the present invention, there is provided a semiconductor device having a dual damascene wiring structure, comprising at least one of a via and a wire made of conductive material having a side wall, and a low dielectric constant interlayer insulating film having a face layer portion contacting at least a portion of the side wall of the via or the wire and an inner portion other than the face layer portion, wherein the interlayer insulating film contains Si, O and H or alternatively Si, O, C and H as a predominant element and the face layer portion is higher in density than the inner portion, or, comprising at least one of a via and a wire made of conductive material having a side wall, and a barrier film or an etching stop film having a face layer portion contacting at least a portion of the side wall of the via or the wire and an inner portion other than the face layer portion, wherein the barrier film or the etching stop film contains Si, C, N and H or alternatively Si, C and H as a predominant element and the face layer portion is higher in density than the inner portion.

According to the present invention, there is provided a semiconductor device having a dual damascene wiring structure, comprising at least one of a via and a wire made of conductive material having a side wall, and a low dielectric constant interlayer insulating film having a face layer portion contacting at least a portion of the side wall of the via or the wire and an inner portion other than the face layer portion, wherein the interlayer insulating film contains Si, O and H as a predominant element and the face layer portion is higher in a ratio of Si—O bond and lower in a ratio of Si—H bond than the inner portion, or the interlayer insulating film contains Si, O, C and H as a predominant element and the face layer portion is higher in a ratio of Si—O bond and lower in a ratio of Si—$CH_3$ bond than the inner portion, or, comprising at least one of a via and a wire made of conductive material having a side wall, and a barrier film or an etching stop film having a face layer portion contacting at least a portion of the side wall of the via or the wire and an inner portion other than the face layer portion, wherein the barrier film or the etching stop film contains Si, C, N and H or alternatively Si, C and H as a predominant element and the face layer portion is lower in a ratio of Si—$CH_3$ bond than the inner portion.

In the present invention, the thickness of the face layer portion is preferably set to 30 nm or less in order to suppress increase of the dielectric constant. The low dielectric constant interlayer insulating film containing Si, O and H as a predominant element may be ladder hydrogenated siloxane, and L-Ox (registered trademark) may be used as the ladder hydrogenated siloxane.

As described above, according to the present invention, the annealing treatment, the plasma treatment, the UV treatment, the organic solvent treatment or the like may be conducted as the pre-treatment for forming the resist pattern, whereby the reaction inhibiting materials such as amine, etc. remaining in wafer, particularly in the low dielectric-constant interlayer insulating film can be surely removed. Furthermore, a modified film having modified composition, density or bond state is formed by conducting the annealing treatment or the UV treatment on a face layer of the insulating film, the barrier film or the etching stop film confronting the via hole or the wiring trench pattern formed therein, whereby adhesion of the reaction inhibiting materials in air to the film or influence of the reaction inhibiting materials in the insulating film can be suppressed. Therefore, the present invention can solve the problem that the resolution of a resist pattern is degraded in the process containing a step of forming the resist pattern subsequently to a wet treatment using organic peeling liquid or cleaning liquid which contains amine, etc. as in the case of a dual damascene process such as a via-first process, a dual hard mask process, a trench-first process or the like, or a step of forming the resist pattern subsequently to formation of the via hole or the wiring trench pattern.

BRIEF DESCRIPTION OF THE DRAWINGS

FIGS. 1A to 1C are cross-sectional views showing the procedure of a via first process according to a first embodiment of the present invention;

FIGS. 2A to 2C are cross-sectional views showing the procedure of the via first process according to the first embodiment of the present invention;

FIGS. 3A to 3C are cross-sectional views showing the procedure of the via first process according to the first embodiment of the present invention;

FIG. 4 is a diagram showing the construction of a gas analysis system to set the condition of an annealing treatment according to the first embodiment of the present invention;

FIGS. 6A and 6B are graphs showing gas analysis results achieved for a sample using $SiO_2$ as an interlayer insulating film and a sample using a dielectric-constant film as an interlayer insulating film;

FIGS. 11A to 11C are cross-sectional views showing the procedure of a via first process according to a second embodiment of the present invention;

FIGS. 12A to 12C are cross-sectional views showing the procedure of the via first process according to the second embodiment of the present invention;

FIGS. 13A to 13C are cross-sectional views showing the procedure of the via first process according to the second embodiment of the present invention;

FIGS. 14A to 14C are cross-sectional views showing the procedure of a dual hard mask process according to a third embodiment of the present invention;

FIGS. 15A to 15C are cross-sectional views showing the procedure of the dual hard mask process according to the third embodiment of the present invention;

FIGS. 17A to 17C are cross-sectional views showing the procedure of a via first process according to a fourth embodiment of the present invention;

FIGS. 18A to 18C are cross-sectional views showing the procedure of the via first process according to the fourth embodiment of the present invention;

FIGS. 20A to 20C are cross-sectional views showing the procedure of a trench first process according to the fourth embodiment of the present invention;

FIGS. 21A to 21C are cross-sectional views showing the procedure of the trench first process according to the fourth embodiment of the present invention;

FIGS. 23A to 23C are cross-sectional views showing the procedure of a conventional via first process;

FIGS. 24A to 24C are cross-sectional views showing the procedure of the conventional via first process;

FIGS. 25A to 25C are cross-sectional views showing the procedure of the conventional via first process;

FIGS. 27A and 27B show extraction results of the method of FIGS. 25A to 25C; and FIG. 28 is a diagram showing a mechanism for the resolution degradation of the resist pattern.

DETAILED DESCRIPTION OF THE PREFERRED EMBODIMENTS

In a case where PR step is carried out sequentially to a wet treatment step such as a wet peeling or stripping or removing step, a cleaning step or the like, when antireflection coating or resist is coated with no pre-treatment like a conventional damascene process, reaction inhibiting materials such as basic chemical materials or the like infiltrated into a substrate invade through the antireflection coating into the resist. As a result, there occurs the problem that the chemical reaction of the resist due to light exposure is inhibited, and the resist pattern suffers resolution failure.

Particularly, this problem frequently occurs in the case where a low dielectric-constant insulating film is used in place of silicon oxide. This is because the low dielectric-constant material is more liable to accept the reaction inhibiting materials therein because the low dielectric-constant material has a higher void density than the silicon oxide film, so that the low dielectric-constant material gradually exudes in the baking process of the antireflection coating or resist. Further, in a via-first process in which via holes are preferentially processed, organic peeling or stripping or removing liquid used after the via hole etching infiltrates deeply into the substrate along the via holes.

Therefore, in order to solve the above problem, the following test has been carried out to identify the reaction inhibiting materials which cause degradation of the resolution of the resist pattern.

Figure 26:
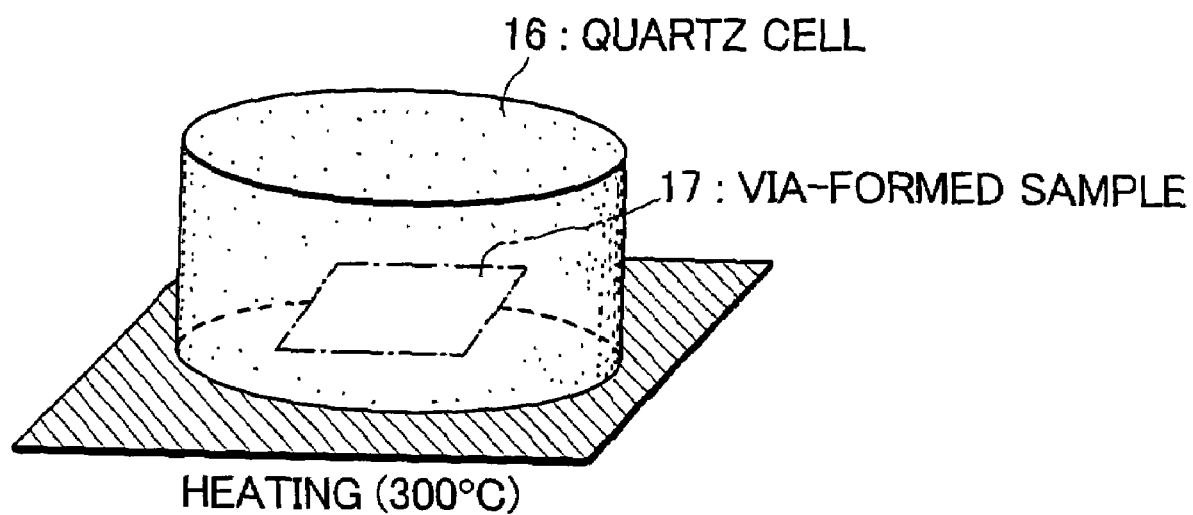
FIG. 26 is a diagram showing a method of extracting materials infiltrated into the interlayer insulating film.

First, a via-formed sample 17 in which via holes 9 were foiled by the conventional method (see FIG. 23B) was prepared, and the via-formed sample 17 was put in a quartz cell 16 and heated at a temperature of 300° C. as shown in FIG. 26. Thereafter, materials occurring due to the heating were extracted into pure water after the sample 17 was cooled, and the components were identified by capillary cataphoresis. The result is shown in FIGS. 27A and 27B. As is apparent from FIGS. 27A and 27B, it is found that in the comparison between the analysis result of a standard sample having no via hole shown in FIG. 27A and the analysis result of the via-formed sample 17 shown in FIG. 27B, the materials surrounded by a broken line (amine A and amine B, hereinafter referred to as "amine components") each have the peak at the same migration time under cataphoresis in capillary. The components determined here are components of amine type organic peeling liquid. Accordingly, it is ascertained that the components of amine type organic peeling liquid adheres to the surface of the substrate.

That is, in the via-first process, etching residual materials are removed by using amine-based alkaline organic peeling or stripping or removing liquid in the organic peeling or stripping or removing process carried out after the via holes are etched. In this process, the organic peeling liquid infiltrates into the first interlayer insulating film 6 and the second interlayer insulating film, and it is not perfectly removed even in the subsequent cleaning step. Particularly, a low dielectric-constant organic/inorganic interlayer insulating film has a higher micro-void density, and the reaction inhibiting materials infiltrate into these micro voids. These reaction inhibiting materials in the micro voids exude through the second antireflection coating 2b into the resist when the second antireflection coating 2b and the resist are baked.

A mechanism showing that the amine components induce the resolution failure of the resist pattern will be described with reference to FIG. 28.

First, acid generating agent (onium salt type acid generating agent, diazomethane type acid generating agent, sulfonic ester type acid generating agent or the like) contained in a positive type resist is photolyzed by light exposure and acid is generated. Protecting groups such as acetal groups having a dissolution inhibiting effect on developing liquid are changed to hydroxyl groups by a deblocking reaction based on the acid catalyst, so that the polarity of the resist is changed and is liable to be dissolved in the developing liquid. Accordingly, when the basic amine components infiltrate into the resist, the acid catalyst is deactivated by neutralization and the deblocking reaction described above is inhibited. Such phenomenon is called "poisoning".

It is estimated that, as a result, the solubility of the resist material into the developing liquid is lowered, the resist resolution is lowered and the resist embedded in the via holes is partially left, thereby inducing degradation of the pattern resolution. Further, the resolution failure of the resist pattern likewise occurs due to the residual materials of hydrofluoric acid hydrogen peroxide used in a Cu back surface cleaning step before PR.

The inventors of the present invention have found out that the above poisoning is caused not only by the amine components but also in accordance with the concentration of specific elements such as nitrogen, hydrogen, carbon and the like which constitute the insulating film such as the interlayer insulating film or the etching stop film. If a next resist pattern is formed under such a condition that the interlayer insulating film or the etching stop film is exposed to the via-hole or the wiring trench pattern formed therein, the reaction inhibiting materials in the insulating film act on the resist to cause the same problem as in the case of amine components.

Therefore, according to the present invention, an annealing treatment, a plasma treatment, a UV treatment, an organic solvent treatment with organic solvent containing acidic or weakly basic compound or the like is conducted as a pre-treatment for coating resist or antireflection coating to effectively remove the reaction inhibiting materials such as amine, hydrofluoric acid hydrogen peroxide, etc. remaining in the wet process, or the annealing treatment or the UV treatment is conducted as a pre-treatment to form a modified layer having a modified composition, density or bond state on the face of the insulating film exposed to the via hole or the wiring trench pattern at the inner face thereof so as to suppress adhesion of the reaction inhibiting materials floating in air to the insulating film or suppress influence of the reaction Inhibiting materials in the insulating film, thereby suppressing occurrence of poisoning and improving the resolution failure of the resist pattern.

The annealing treatment is carried out at a temperature of 150° C. to 450° C., preferably at a temperature of 200° C. to 450° C. to surely eliminate the reaction inhibiting materials or form the modified layer. When the annealing treatment is carried out, it is preferably carried out under a pressure-reduced condition, under inert gas atmosphere of nitrogen, argon or the like or under hydrogen atmosphere.

In order to remove the reaction inhibiting materials attached in the neighborhood of the surface, it is effective to wash out them with solvent (thinner) before the antireflection coating is coated. Further, in order to remove the reaction inhibiting materials exuding up to the upper surface of the antireflection coating in the bake step after the antireflection coating is coated, a thinner treatment after the antireflection coating is coated is effective. The cleaning process using organic solvent containing acidic material or organic solvent containing weak basic material in place of the thinner treatment described above is more effective to remove the alkaline reaction inhibiting materials. In order to neutralize the reaction inhibiting materials, it is effective to contain acid in the antireflection coating itself.

Further, the UV treatment is a method of removing the reaction inhibiting materials by oxygen or ozone activated by the irradiation of the UV light. The plasma treatment is a method of physically etching or oxidizing the exposed surface of the interlayer insulating film by using plasma of gas such as oxygen, hydrogen, nitrogen, ammonia or the like. The UV treatment and the plasma treatment have not only an effect of removing the reaction inhibiting materials, but also an effect of reforming the exposed substrate surface to improve wettability of the antireflection coating and the resist coated after the UV treatment or the plasma treatment. It is preferable to carry out the UV treatment by using a high pressure mercury lamp or excimer laser of wavelength of 100 nm to 500 nm at an irradiation intensity of 50 mW/cm$^2$ or more. Especially, according to the UV treatment with use of oxygen, a modified layer having a modified composition, density or bond state can be formed on the face of the insulating film exposed to the via hole or the wiring trench pattern at the inner wall thereof so as to suppress the influence of the reaction inhibiting materials in air or the insulating film.

Next, the specific procedure of the damascene process to which the above pre-treatments are applied will be described on the basis of the following examples. It is well known that amine is contained in organic peeling liquid, however, it is a novel fact achieved from the knowledge of the inventors of the present invention that amine affects the resolution of the resist pattern and the concentration of the elements such as nitrogen, hydrogen, carbon, etc. contained in the insulating film also functions as the reaction inhibiting materials in the same manner as the case of amine.

EXAMPLES

Next, examples of the present invention will be described hereunder with reference to the accompanying drawings to describe the present invention in more detail.

Both the amine contained in the chemical solution such as organic peeling liquid, cleaning liquid, etc. and the composition of elements such as nitrogen, hydrogen, carbon, etc. contained in the insulating film influence the poisoning phenomenon, however, details of the pre-treatment for a case of removing only the residual amine are different from those of another case of suppressing adhesion of the amine in air or suppressing influence of the reaction inhibiting materials in the insulating film. For the purpose of simple explanation, the first to third examples focus on the method for effective removal of the residual amine, while the fourth example focuses on the method of suppressing adhesion of the amine in air and suppressing influence of the reaction inhibiting materials in the insulating film. In the following examples, the dual damascene method is shown basically as to only one wiring layer where the via and the wire are formed simultaneously, however, it should be noted that the process may be conducted repeatedly to form a plurality of wiring layers.

Example 1

A first example of a semiconductor device and its manufacturing method to which the present invention relates will be described with reference to FIGS. 1A to 10C.

Figure 5B:
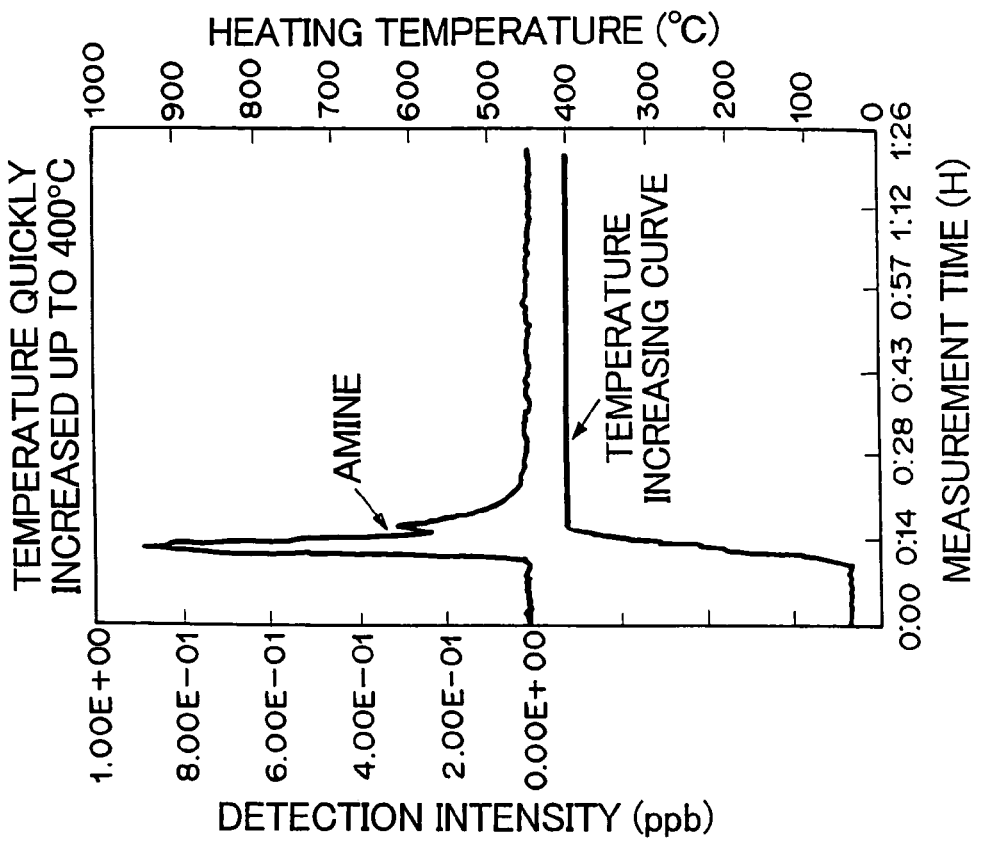
FIGS. 5A and 5B are graphs showing analysis results achieved by the gas analysis system.
Figure 5A:
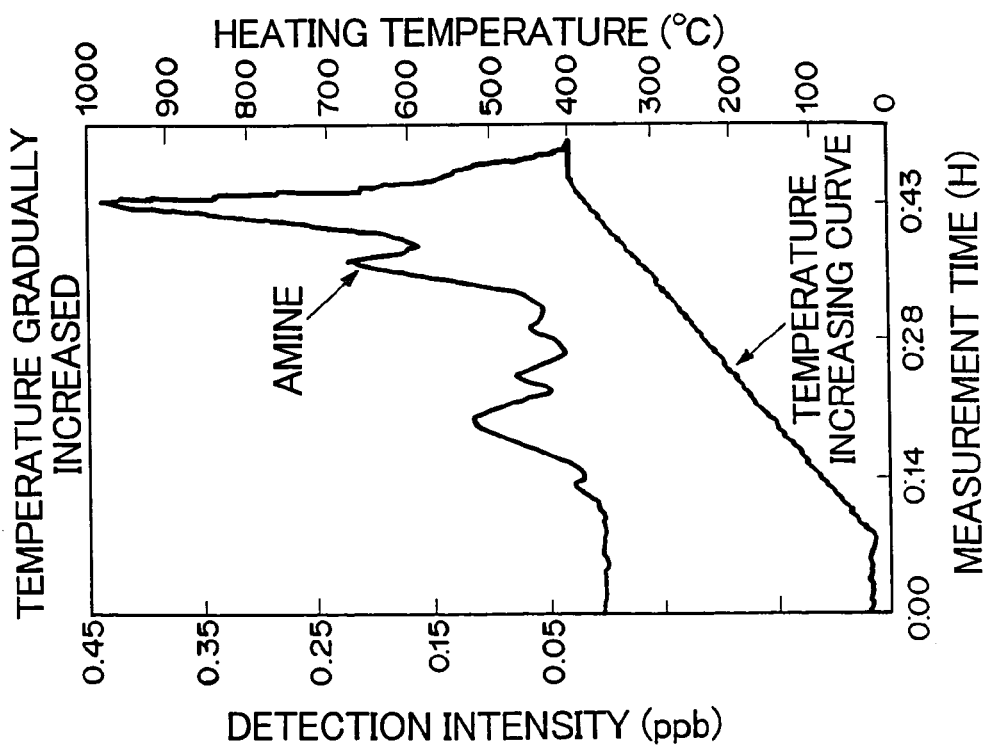
Figure 8:
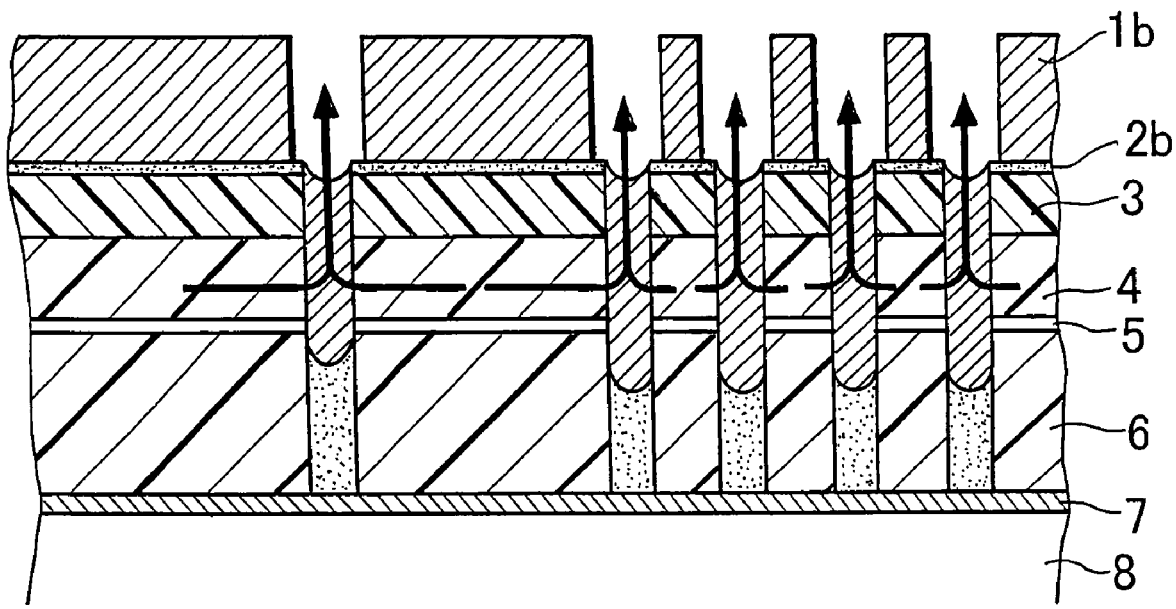
FIG. 8 is a diagram showing the difference in effect of amino components due to the difference in via pattern interval.
Figure 9A:
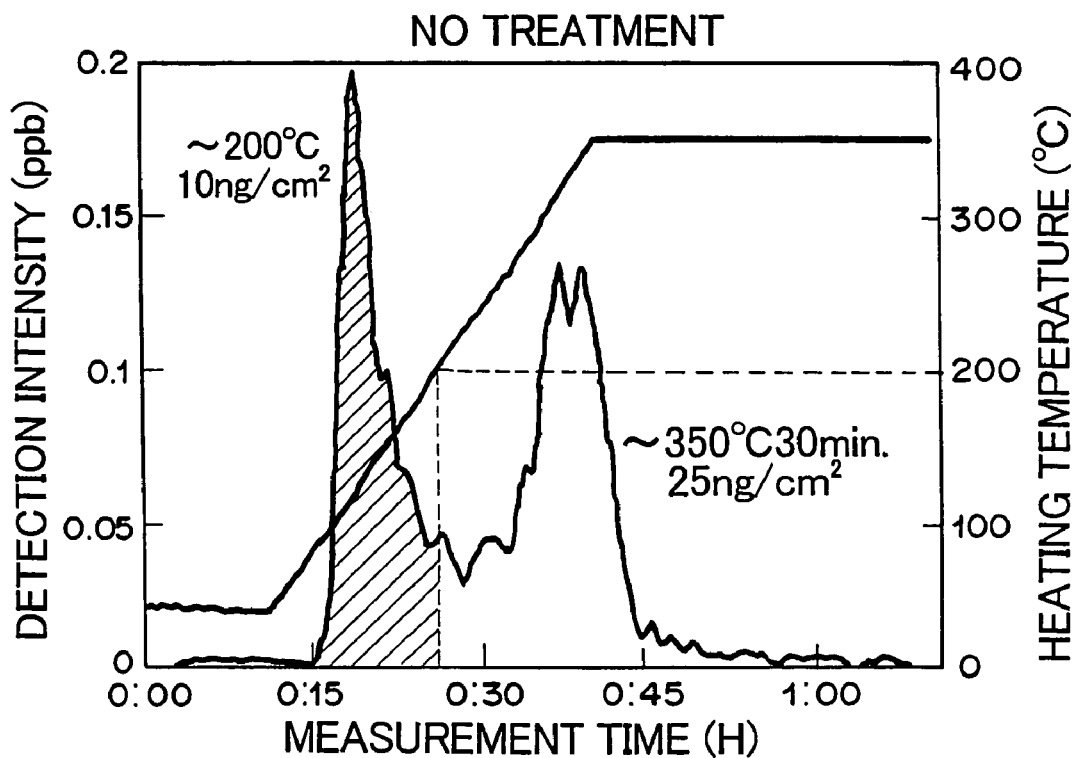
FIGS. 9A and 9B are graphs showing the effect of a UV treatment according to the first embodiment of the present invention.
Figure 9B:
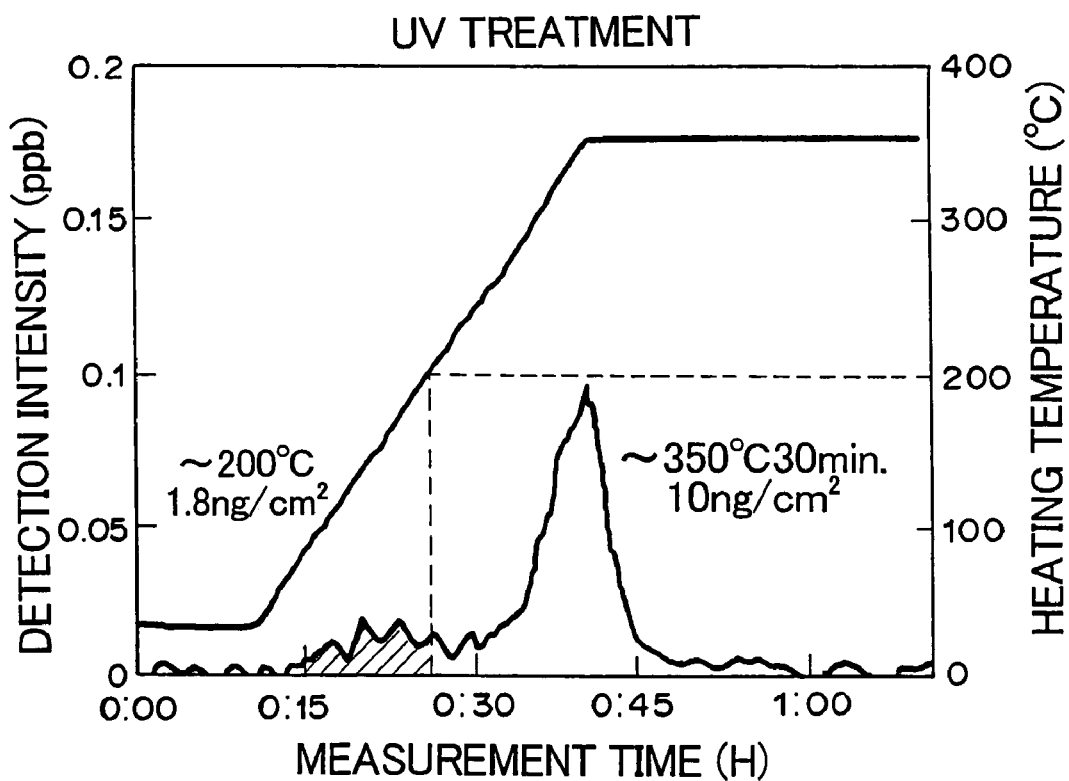
Figure 10A:
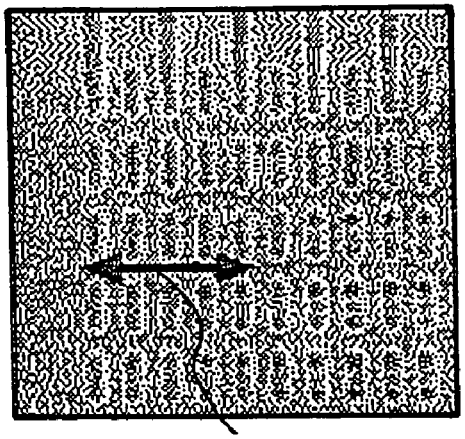
FIGS. 10A to 10C show the effect of an organic solvent treatment according to the first embodiment of the present invention.
Figure 10B:
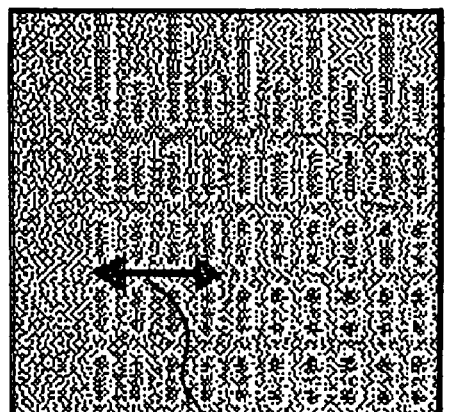
Figure 10C:
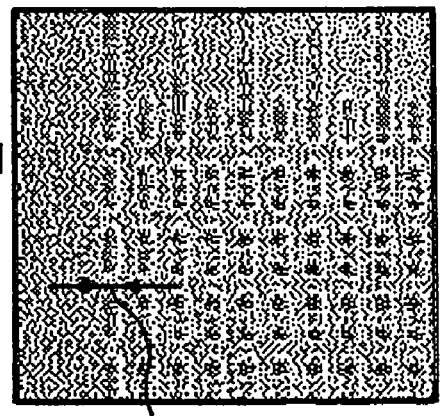
Figure 16:
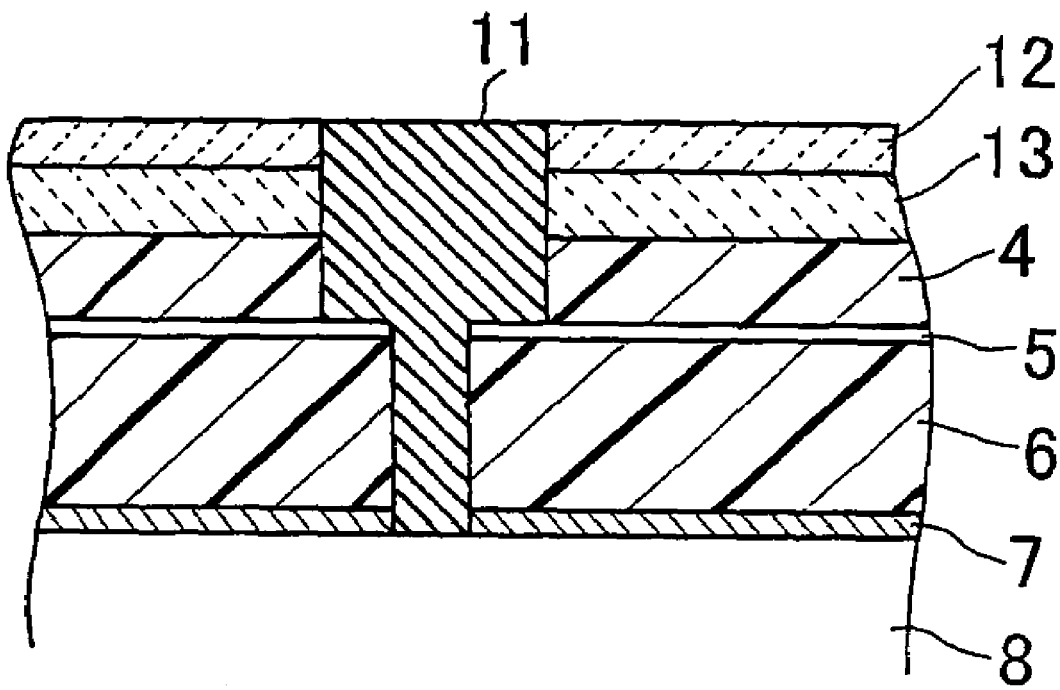
FIG. 16 is a cross-sectional view showing the procedure of the dual hard mask process according to the third embodiment of the present invention.

FIGS. 1A to 3C are cross-sectional views showing the procedure of a via-first process of the first example, and as a matter of convenience of drawing, it is illustrated as being divided into plural diagrams. FIG. 4 is a diagram showing the construction of a gas analysis system to set the condition of an annealing treatment. FIGS. 5A and 5B show analysis results thereof. FIGS. 6A to 7B are diagrams showing the difference between a case where $SiO_2$ is used as an interlayer insulting film and another case where a low dielectric-constant film is used as an interlayer insulting film and FIG. 8 is a diagram showing the difference in effect of amine component due to the difference in via pattern interval. Further, FIGS. 9A and 9B are diagrams showing the effect of a UV treatment, and FIGS. 10A to 10C show the effect of an organic solvent treatment.

A via-first process according to this embodiment will be described hereunder.

First, as shown in FIG. 1A, a lower layer wire (not shown) of Cu or the like is formed on a wiring substrate 8 by a well-known method, and then a first etching stop film 7, a first interlayer insulating film 6 and a second etching stop film 5 are successively formed by using a CVD method, a plasma CVD method or the like so that each film has a predetermined film thickness. On the second etching stop film 5 is deposited $SiO_2$, an organic low dielectric-constant film, an organic material-contained silicon oxide film, an organic or inorganic porous film, L-Ox™, a fluorine-contained insulating film thereof or the like, thereby forming a second interlayer insulating film 4. Thereafter, a cap insulating film 3 is formed.

The first interlayer insulating film 6, the cap insulating film 3, the first etching stop film 7 and the second etching stop film 5 may be formed of any combination of materials so as to achieve a selection ratio of the etching, and the materials are properly selected from $SiO_2$, SiC, SiN, SiON, SiCN, etc. Further, when $SiO_2$ is used for the second interlayer insulating film 4, it is unnecessary to form the cap insulating film 3. However, when materials other than $SiO_2$ are used, there may occur a problem in CMP step of wires. In this case, it is required to form the cap insulating film 3.

Thereafter, a first antireflection coating 2a for suppressing reflection of exposure light is deposited at a thickness of about 50 nm, a chemical amplification type or chemical sensitization type resist is coated at a thickness of about 600 nm, and then the light exposure and development based on KrF photolithography is carried out to form a first resist pattern 1a.

Subsequently, as shown in FIG. 1B, the first antireflection coating 2a, the cap insulating film 3, the second interlayer insulation film 4, the second etching stop film 5 and the first interlayer insulating film 7 are successively etched to form via holes 9 so that the via holes 9 penetrate through these films. Thereafter, the resist pattern 1a and the first antireflection coating 2a are peeled off by oxygen plasma ashing and a wet treatment using organic peeling liquid, and the residual materials of the dry etching are removed.

According to the conventional technique, in the next resist pattern forming step, no pre-treatment is carried out or only the dehydration bake or the thinner pre-wet is carried out at a temperature of 150° C. to 250° C. for about 2 minutes as a pre-treatment by a coating machine before a second antireflection coating 2b is coated. However, as described above, the conventional technique has the problem that the amine components contained in the organic peeling liquid infiltrate into the first interlayer insulating film 6 and the second interlayer insulating film 4, particularly the interlayer insulating film formed of the low dielectric-constant film, exude in the bake process after the coating of the second antireflection film 2b and the resist and then penetrate through the second antireflection film 2b into the resist to thereby lower the resolution of the resist. In view of the foregoing problem, this example is characterized in that the following treatment is carried out as a pre-treatment to form the second resist pattern 1b.

Any method may be used for the pre-treatment insofar as reaction inhibiting materials such as amine components, etc. infiltrating into the interlayer insulating film, the etching stop film and the cap insulating film can be surely removed by the method. For example, as the pre-treatment may be used an annealing treatment under predetermined temperature and time conditions, a plasma treatment for physically etching the first interlayer insulating film 6 and the second interlayer insulating film 4 exposed to the inner wall of the via holes to remove the amine components, a UV treatment for neutralizing the amine components by oxidizing agent such as oxygen, ozone or the like which is activated by UV light, an organic solvent treatment for neutralizing amine or replacing amine into weak base with organic solvent containing acidic or weakly basic material or the like.

These methods have respective characteristics, and for example the annealing treatment is generally carried out in the semiconductor process and thus it can be easily adopted. However, it takes long time to carry out the heating treatment, and the amine components existing in the atmosphere may be absorbed by wafer again when the wafer is picked up from an anneal furnace. In the plasma treatment, the UV treatment and the organic solvent treatment, the treatment time is short. Particularly in the plasma treatment and the UV treatment, the surface of the substrate is reformed to thereby improve the wettability of the antireflection coating and the resist coated subsequently. Accordingly, it is preferable that the treatment choice is properly determined on the basis of the performance of devices to be required, the number of manufacturing steps, facilities being used, etc., and these treatments may be used alone or in combination. The combination process of carrying out the UV treatment after the annealing treatment and before the coating of the antireflection coating is particularly effective.

Here, a case where the annealing treatment is carried out as the pre-treatment will be described.

When the conditions such as the annealing temperature, the annealing time, etc. of the annealing treatment are set, the effect of removing the amine components is enhanced as the annealing treatment is carried out at a higher temperature for a longer time. However, the high-temperature and long-time annealing treatment not only increases the number of manufacturing steps, but also causes diffusion of Cu (wiring material), etc., so that the device characteristic may be deteriorated.

Therefore, in order to determine preferable annealing temperature and time for the annealing treatment, samples having different anneal conditions were prepared, and gas components eliminated from wafer were analyzed according to mass spectrometry using a gas analysis system shown in FIG. 4 (TD-API-MS method). Specifically, wafer was put in a heating furnace with a gas collecting quartz cell put on a sample (via-formed wafer), and the sample was heated by an infrared heater under the state that high-purity Ar gas was supplied into the furnace while adjusting the flow rate of the Ar gas by a mass flow controller. Gas eliminated from the wafer was introduced into an API-MS apparatus and analyzed. The analysis result is shown in FIGS. 5A and 5B.

FIG. 5A is a graph showing the temperature increasing curve and the detection intensity of the amine components when the sample is gradually (every about 10° C./minute) increased from the normal temperature to 400°, and it is apparent from FIG. 5A that amine components are gradually eliminated as the temperature increases. FIG. 5B is a graph showing a case where the temperature is increased in a short time from the normal temperature to 400° C. and then kept at 400° C., and it is apparent from FIG. 5B that most of amine components are eliminated within about 20 minutes from the start of the temperature increase, and no amine component is detected after 20 minutes.

As described above, the amine components can be surely removed by increasing the temperature to about the temperature (400° C.) at which amine is vaporized. Particularly, the amine components can be effectively removed in a short time (about 20 minutes) by quickly increasing the temperature. Even when the sample is kept at 400° C. thereafter, no amine component is detected. Therefore, it is apparent that the amine removing effect acts on not only the amine components attached onto the surface of the sample, but also the amine components infiltrated in the interlayer insulating film.

The annealing temperature is not limited to 400° C. Even when the annealing temperature is less than 400° C., the amine components could be removed if a long annealing time is set. According to the experiments of the inventors of this invention, it is discovered that the annealing temperature is preferably set in the range from 150° C. to 450° C. Further, in order to suppress elimination of amine components in the baking process of the antireflection coating and the resist, it is preferable that the lower limit of the annealing temperature is set to 200° C. (baking temperature) or more. The annealing treatment is preferably conducted under a pressure-reduced condition, under inert gas atmosphere of nitrogen, argon or the like or under hydrogen atmosphere in order to prevent oxidation of the substrate.

After the amine components in the first interlayer insulating film 6 and the second interlayer insulating film 4 are removed by the annealing treatment, the second antireflection coating 2b is coated at a thickness of about 50 nm and then baked as shown in FIG. 1C. At this time, the antireflection coating 2b is partially embedded in the via holes 9.

Subsequently, as shown in FIG. 2A, a chemical amplification type resist is coated at a thickness of about 600 nm on the antireflection coating 2b and then baked, and then a second resist pattern 1b to form wiring trench patterns is formed by the light exposure and development based on KrF photolithography (see FIG. 2B). In the conventional manufacturing method, the amine components in the organic peeling liquid used to remove the residual materials of the via-hole etching filtrate into the interlayer insulating film, and infiltrate into the resist in the baking step of the antireflection coating and the resist, so that the pattern resolution of the resist is lowered. However, according to this example, the annealing treatment is carried out to sufficiently remove the amine components before the antireflection coating 2b is coated, so that the resolution of the resist pattern can be kept excellently.

Thereafter, the second antireflection coating 2b is removed by the dry etching method as shown in FIG. 2C, and then the cover insulating film 3 and the second interlayer insulating film 4 are etched by using the second etching stop film 5 as an etching stopper as shown in FIG. 3A, thereby forming the wiring trench patterns 10.

Subsequently, as shown in FIG. 3B, the second resist pattern 1b and the second antireflection coating 2b are peeled off by the oxygen plasma ashing and the wet treatment using the organic peeling liquid to remove the residual materials of the dry etching. Thereafter, the first etching stop film 7 is removed, the wiring material 11 of Cu or the like is embedded in the wiring trench patterns 10 thus achieved, and then the surface of the wiring material 11 is polished and flattened by using the CMP method, thereby completing the dual damascene structure (see FIG. 3C).

From SEM observation of the via-formed wafer thus formed, it has been found that there was no pattern resolution failure and the annealing treatment of this example was effective to remove amine. The effect of this example is more remarkable when low dielectric-constant film is used as the second interlayer insulting film 4. In order to ascertain the difference, API-MS analysis was carried out on a sample using low dielectric-constant film as the second interlayer insulating film 4 and another sample using silicon oxide film as the second interlayer insulating film 4 by using the gas analysis system shown in FIG. 4. The analysis results are shown in FIGS. 6A and 6B, and the SEM observation results are shown in FIGS. 7A and 7B.

FIG. 6A shows the detection amounts of amine A (left side) and amine B (right side) when the silicon oxide film is used as the second interlayer insulating film 4. The detection amounts of amine A and amine B are respectively equal to 6.1 $ng/cm^2$ and 63 $ng/cm^2$, which are not so high values. On the other hand, when the low dielectric-constant film is used as the second interlayer insulating film 4, the detection amounts of amine A and amine B are respectively equal to 44 $ng/cm^2$ and 220 $ng/cm^2$, which are high values. This shows that the effect of amine is remarkable in the process using the low dielectric-constant film and thus the pre-treatment of this example is needed.

Figure 7A:
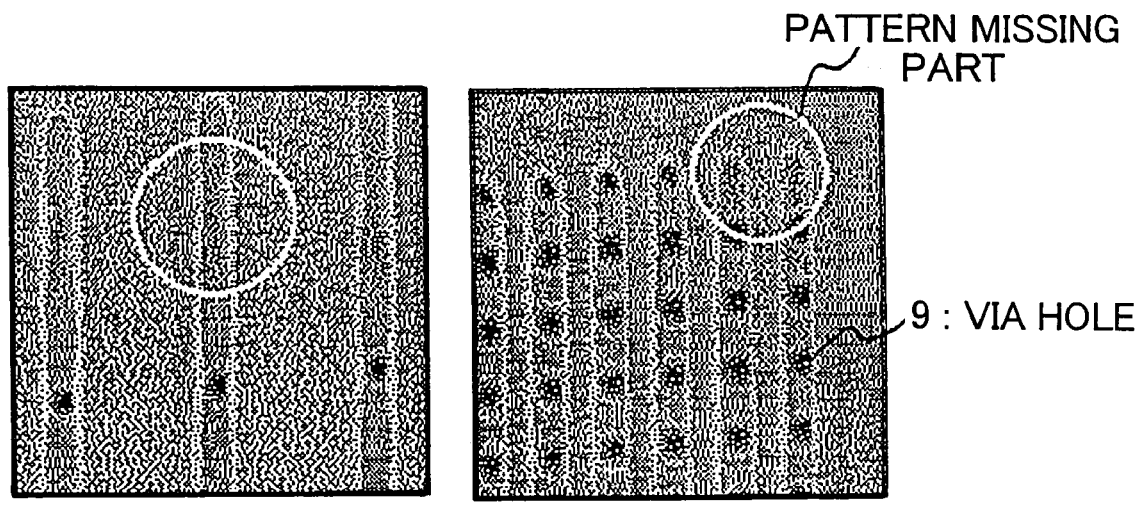
FIGS. 7A and 7B show SEM observation results achieved for the sample using $SiO_2$ as the interlayer insulating film and the sample using the dielectric-constant film as the interlayer insulating film.
Figure 7B:
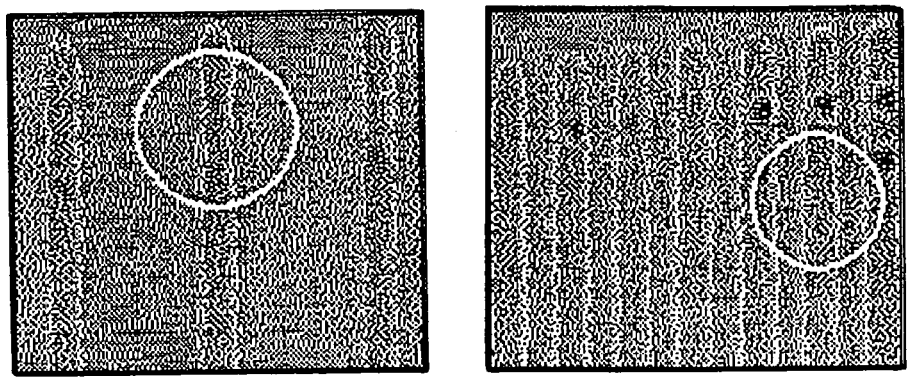

Checking this by using SEM photographs, it is apparent as shown in FIG. 7A that when the silicon oxide film is used as the second interlayer insulating film 4, the resist pattern is lost at the tip portions of the wiring trench patterns which are surrounded by a white circle, and no via hole (shown by a black area) is formed. On the other hand, it is apparent as shown in FIG. 7B that when the low dielectric-constant film is used as the second interlayer insulating film 4, most of via holes 9 to be originally formed are missing, and thus the influence of the amine components is remarkable in the case of the low dielectric-constant film.

Such a trouble appears more remarkably at a portion where wiring patterns are isolated from one another than at a portion where wiring patterns are dense. That is, as shown in FIG. 8, the width of the interlayer insulating film between the patterns is narrow at the pattern dense portion (at the right side of FIG. 8), and the amount of amine components infiltrating in the interlayer insulating film is small, so that the pattern is little deformed at the pattern dense portion. However, the amine components exude from the surrounding large-area interlayer insulating film at the pattern-isolated portion (at the left side of FIG. 8), and thus the pattern is liable to be deformed. Accordingly, the annealing treatment of this example is more important in semiconductor devices having a large number of isolated patterns.

In the foregoing description, the annealing treatment is used as an amine removing method. The plasma treatment, the UV treatment, the organic solvent treatment, etc. may be used as other amine removing methods as described above. Further, any combination of the annealing treatment, the plasma treatment, the UV treatment, the organic solvent treatment, etc. may be adopted, and these treatments may be selectively adopted in accordance with the device figuration.

In order to confirm the effect of the UV treatment, both of a sample which was subjected to the UV treatment (hereinafter referred to as "UV-treated sample") and another sample which was subjected to no treatment ("non-treated sample") were subjected to a heating treatment by the gas analysis system shown in FIG. 4 to analyze eliminated gas. The analysis results are shown in FIGS. 9A and 9B. FIG. 9A shows the measurement result of the intensity of the eliminated gas discharged when the non-treated sample was heated, and FIG. 9B shows the measurement result when the UV-treated sample was heated. Comparing both the samples, the amount of amine components (hatched portion) discharged in a low temperature area below 200° C. (temperature of coating and baking the antireflection coating) is remarkably reduced from 10 $ng/cm^2$ to 1.8 $ng/cm^2$, and it shows that amine can be effectively removed by the UV treatment.

In order to remove the amine components attached in the neighborhood of the surface, washing using organic solvent such as polypyreneglycol monomethyl ether acetate, polypyreneglycol monomethyl ether, ethyl lactate, cyclohexanone, methyl ethyl ketone or the like is effective before the antireflection coating 2b is coated. Further, in order to remove the amine components exuding tip to the upper surface of the antireflection coating 2b through the baking step after the coating of the antireflection coating 2b, the organic solvent treatment after the coating of the antireflection coating 2b is effective. By using organic solvent containing organic acid such as organic carboxylic acid, acetic acid or the like or inorganic acid such as hydrochoric acid or the like in the organic solvent treatment, strongly basic amine components can be neutralized and the effect can be more enhanced. Further, by washing with organic solvent containing weakly basic material, the strongly basic amine components can be substituted into weakly basic materials, and the action of the amine components can be inhibited. Still further, in order to neutralize the amine components, the effect can be more enhanced by containing acid in the antireflection coating itself.

In order to confirm the effects of the organic solvent treatment and the organic solvent treatment with organic solvent containing acidic material, a non-treated sample and samples which were treated with respective organic solvents were prepared, and the number of resist residuals, that is, the number of pattern defects were measured by SEM photographs. FIGS. 10A to 10C show the results based on the SEM photographs. From FIG. 10, it has been found that the non-treated sample shown in FIG. 10A has five resist residuals as indicated by an arrow line (at which the overall area of each elliptic wiring trench pattern is blacked) from the end portion, the sample subjected to the organic solvent (thinner) treatment shown in FIG. 10B has four resist residuals and the sample subjected to the acidic organic solvent shown in FIG. 10C has one resist residual, and thus the amine components can be effectively removed by the organic solvent treatment.

In the foregoing description, the amine components serve as the reaction inhibiting materials lowering the resist resolution. However, the resolution is likewise lowered by residuals of hydrofluoric acid hydrogen peroxide used in the Cu back side cleaning step before PR. The residuals of hydrofluoric acid hydrogen peroxide can be effectively removed by the annealing treatment, the plasma treatment, the UV treatment or the organic solvent treatment or any combination thereof.

Example 2

A second example of the semiconductor device and its manufacturing method to which the present invention relates will be described with reference to FIGS. 11A to 13C.

FIGS. 11A to 13C are cross-sectional views showing the procedure of a via-first process according to the second example, and as a matter of convenience of drawing, it is illustrated as being divided into plural diagrams. This example is characterized in that the antireflection coating is perfectly filled in the via holes, and the structure and the manufacturing method of the other portions are the same as the first example.

First, as in the case of the first example, as shown in FIG. 11A, the lower-layer wire of Cu or the like is formed on the wiring substrate 8 by a well known method, and then the first etching stop film 7, the first interlayer insulating film 6, the second etching stop film 5, the second interlayer insulating film 4 and the cap insulating film 3 are successively formed by the CVD method, the plasma CVD method or the like. Thereafter, the first antireflection coating 2a of about 50 nm in thickness and a chemical amplification type resist of about 600 nm in thickness are coated on the cap insulating film 3, and the light exposure and development based on the KrF photolithography are carried out to form the first resist pattern 1a.

Subsequently, as shown in FIG. 11B, the first antireflection coating 2a, the cap insulating film 3, the second interlayer insulating film 4, the second etching stop film 5 and the first interlayer insulating film 7 are successively etched by the well-known dry etching to form the via holes 9 penetrating through these films. Thereafter, the resist pattern 1a and the first antireflection coating 2a are peeled by the oxygen plasma ashing and the wet treatment using the organic peeling liquid, and the residuals of the dry etching are removed.

Subsequently, as in the case of the first example described above, as the pre-treatment for formation of the second resist pattern is carried out the anneal treatment under predetermined temperature and time conditions, the plasma treatment for physically etching the inner walls of the via holes 9 to remove the amine components, the UV treatment for neutralizing the amine components with oxidizing agent such as oxygen, ozone or the like which is activated by UV light, the organic solvent treatment for neutralizing amine or substituting amine into weak alkaline with organic solvent containing acidic or weakly basic material, or any combination of these treatments.

After the amine components in the interlayer insulating film are removed by the pre-treatment, the second antireflection coating 2b of about 50 nm is coated and baked as shown in FIG. 11C. At this time, in this example, the via holes 9 are perfectly embedded with the antireflection coating 2b in order to make uniform the thickness of the resist coated on the second antireflection coating 2b so that the pattern resolution is enhanced and the second resist pattern 1b can be easily removed.

Subsequently, as shown in FIG. 12A, after the chemical amplification type resist is coated on the antireflection coating 2b at a thickness of about 600 nm and baked, the light exposure and development based on the KrF photolithography are carried out to form the second resist pattern 1b for formation of the wiring trench patterns (see FIG. 12B). At this time, as in the case of the first example, a predetermined pre-treatment is conducted before the antireflection coating 2b is coated, and then a sufficient amount of amine components are removed, so that the resolution of the resist pattern can be excellently kept.

Subsequently, the second antireflection coating 2b, the cap insulating film 3 and the second interlayer insulating film 4 are subjected to the dry etching in the first example described above. However, in the second example, the second antireflection coating 2b is filled in the via holes 9, and the etching speed of the second antireflection coating 2b is lower than that of each of the cap insulating film 3 and the second interlayer insulating film 4. Therefore, only the second antireflection coating 2b is etched until the wire layer portion by anisotropic etch-back using oxygen plasma as shown in FIG. 12C. Subsequently, as shown in FIG. 13A, the cover insulating film 3 and the second interlayer insulating film 4 are etched by using the second etching stop film 5 as an etching stopper to form the wiring trench patterns 10.

Subsequently, as shown in FIG. 13B, by the oxygen plasma ashing and the wet treatment using the organic peeling liquid, the second resist pattern 1b and the second antireflection coating 2b are peeled off and the residual materials of the dry etching are removed. After the first etching stop film 7 is removed, the wire material 11 of Cu or the like is embedded in the wiring trench patterns 10 achieved, and it is polished to flatten the surface by using the CMP method, thereby completing the dual damascene structure (see FIG. 13C).

Checking the via-formed wafer thus formed on the basis of SEM photographs, no pattern resolution failure was observed, and the annealing treatment of this example has been proved to be effective to remove amine. In this example, since the second antireflection coating 2b is filled in the via holes 9, the disadvantage that the resist remains at the upper portion of the via holes 9 occurs hardly. Further, since the path extending from the inner walls of the via holes 9 through the second antireflection coating 2b to the resist is long, the device of this example hardly suffer the influence of the amine components even when the amine components remain somewhat in the interlayer insulating film.

Example 3

Next, the semiconductor device and its manufacturing method according to a third example of the present invention will be described with reference to FIGS. 14A to 16. FIGS. 14A to 16 are cross-sectional views showing the procedure of a dual hard mask process according to the third example, and as a matter of convenience of drawing, it is illustrated as being divided into plural diagrams. This example is characterized in that the wiring trench pattern is formed by using a hard mask.

As in the case of the first and second examples, as shown in FIG. 14A, the lower-layer wire of Cu or the like is formed in the wiring substrate 8 by a well-known method, and then the first etching stop film 7, the first interlayer insulating film 6, the second etching stop film 5 and the second interlayer insulating film 4 are successively formed by using the CVD method, the plasma CVD method or the like. Subsequently, in this embodiment, a hard-mask film lower portion 13 and a hard mask film 12 which will serve an etching mask for the wiring trench patterns are deposited at a predetermined thickness on the second interlayer insulating film 4 by using a predetermined material. Thereafter, the first antireflection coating 2a of about 50 nm in thickness and the chemical amplification type resist of about 600 nm in thickess are coated on the hard mask film 12, and then the light exposure and development based on the KrF photolithography are carried out to form the first resist pattern 1a.

Subsequently, as shown in FIG. 14B, the hard mask 12 is etched with the first resist pattern 1a by well-known dry etching to form an opening to etch the wiring trench patterns. Thereafter, by using the oxygen plasma ashing and the wet treatment using the organic peeling liquid, the resist pattern 1a and the antireflection coating 2a are peeled off and the residuals of the dry etching are removed.

Subsequently, as in the case of the first and second examples, one or any combination of the annealing treatment, the plasma treatment, the UV treatment and the organic solvent treatment is carried out as the pre-treatment to form the second resist pattern.

Subsequently, as shown in FIG. 14C, the second antireflection coating 2b of about 50 nm in thickness and the chemical amplification type resist of about 600 nm in thickness are coated and baked, and then the light exposure and development based on the KrF photolithography are carried out to form the second resist pattern 1b to form the via holes. At this time, as in the case of the first and second examples, a predetermined pre-treatment is carried out before the coating of the antireflection coating 2b to sufficiently remove the amine components, so that the resist pattern resolution can be excellently kept.

Subsequently, as shown in FIG. 15A, the second antireflection coating 2b, the hard-mask film lower portion 13, the second interlayer insulating flm 4, the second etching stop film 5 and the first interlayer insulating film 6 are etched by using the second resist pattern 2b as a mask through well-known dry etching to form the via holes 9 penetrating through these films.

Thereafter, by the oxygen plasma ashing and the wet treatment using the organic peeling liquid, the second resist pattern 1b and the second antireflection coating 2b are peeled off and the residuals of the dry etching are removed as shown in FIG. 15B.

Subsequently, as shown in FIG. 15C, the hard-mask film lower portion 13 and the second interlayer insulating film 4 are etched by using the hard mask film 12 as a mask through the well-known dry etching method to form the wiring trench patterns 10. Thereafter, the second etching stop film 7 is removed, and the wiring material 11 of Cu or the like is embedded in the wiring trench patterns 10 thus formed and polished to flatten the surface thereof by using the CMP method, thereby completing the dual damascene structure (see FIG. 16).

When all the interlayer insulating films are formed of organic films, the manufacturing process may be modified as follows. That is, the second antireflection coating 2b, the hard-mask film lower portion 13, the second interlayer insulating film 4 and the second etching stop film 5 may be etched by using the second resist pattern 1b in the step of FIG. 15B, and the hard-mask film lower portion 13 and the second interlayer insulating film 4 are etched by using the hard mask film 12 in the step of FIG. 15C to form the wiring trench patterns 10. At the same time, the first interlayer insulating film 6 is etched to form the via holes 9 penetrating until the first etching stop film 7.

Upon observation of the via-formed wafer thus formed on the basis of SEM photographs, no pattern resolution failure was observed as in the case of the first and second examples, and it has been proved that the pre-treatment of the third embodiment was effective to remove amine. Further, in this example, no via hole 9 is formed when the second resist pattern 1b is formed, so that the unevenness of the substrate is suppressed and thus the precision of the second resist pattern can be enhanced. In addition, since the etching is carried out by using the hard mask, the processing of the wiring trench patterns is facilitated.

Example 4

A fourth example of the semiconductor device and its manufacturing method to which the present invention relates will be described with reference to FIGS. 17A to 22.

FIGS. 17A to 19 are cross-sectional views showing the procedure of a via-first process according to the fourth example, and FIGS. 20A to 22 are cross-sectional views showing the procedure of a trench-first process according to the fourth example. This example is characterized in that a UV treatment or an annealing treatment or the combination thereof is carried out as the pre-treatment so as to modify the quality such as composition, density, bond state, etc. of a face layer portion of the insulating film exposed to the via hole or the wiring trench pattern at the inner wall thereof.

First, as shown in FIG. 17A, the lower-layer wire 18 of Cu or the like is formed on the wiring substrate 8 by a well known damascene process. Then, as shown in FIG. 17B, the first etching stop film 7 such as SiCN film having a thickness of about 30 to 100 nm, the first interlayer insulating film 6, the second etching stop film 5 and the second interlayer insulating film 4 are successively formed by the CVD method, the plasma CVD method or the like. Here, the second etching stop film 5 used as an etching stop film for forming the wiring trench pattern is made of, for example, SiC or SiCN. If the wires can be stably formed without dispersion by the etching process, the second etching stop film 5 may be omitted. The first interlayer insulating film 6 and the second interlayer insulating film 4 is, for example, a $SiO_2$ film, an inorganic low dielectric constant film L-Ox™ (ladder oxide) or a SiOC-based film. On the low dielectric constant film, a $SiO_2$ film may be formed as a cap insulating film 3 as shown in FIG. 17B.

Subsequently, as shown in FIG. 17C, a first resist pattern 1a is formed by the well-known lithography technique, and the cap insulating film 3, the second interlayer insulating film 4, the second etching stop film 5 and the first interlayer insulating film 7 are etched by the well-known etching technique to form a via hole 9 penetrating them.

Thereafter, the first resist pattern 1a used for the etching of the via hole 9 is removed with oxygen ashing or by using a plasma of nitrogen-hydrogen mixture gas or helium-hydrogen mixture gas. Thereafter, washing is carried out by using amine-based organic peeling liquid, whereby the organic peeling liquid is adsorbed or absorbed by the face layer portion of the films exposed to the via hole 9 especially in case of the films having lower dielectric constant. At this stage, although in the above examples 1 to 3 the annealing treatment, the plasma treatment, the UV treatment, the organic solvent treatment, or the like is carried out, in this example a treatment of UV light irradiation treatment, an annealing treatment at about 200 to 450° C. or the combination thereof is carried out as shown in FIG. 18A in order to modify the face layer portion of the insulating films exposed to the via hole 9 at the inner wall thereof.

As a result, the peeling liquid remaining in the via hole 9 and the liquid taken up in the face layer portion of the interlayer insulating films are removed, and a composition change, densification, bond state change, or the like of the face layer portion of the insulating films exposed to the via hole 9 at the inner wall thereof is performed. Here, although a modified film 19 is depicted in FIG. 18A in order to expressively show such a modification of the insulating films, the interface between the modified film 19 and an inner portion of the insulating film other than the face layer portion is not always clearly formed. However, the effective thickness of the modified film 19 may be about 30 nm or less. The above modification differs from a state of the insulating films hardened and changed in composition by oxygen ashing or the like for peeling the resist off. Property and effect of the modified film 19 is described later.

Subsequently, as shown in FIG. 18B, a second resist pattern 1b is formed by the well-known lithography technique. Here, an organic antireflection coating may be formed under the second resist pattern 1b. It is preferable that the antireflection coating is formed so as not to completely fill the inside of the via hole 9 but to become lower than the height of wire, i.e. existing in the via hole 9 under the level of the second etching stop film 5. Thereafter, the cap insulating film 3 and the second interlayer insulating film 4 are etched by the well-known etching technique to form a wiring trench pattern 10.

In the pre-treatment of this example, since the modified film 19 having large density is formed in the face layer portion of the insulating film exposed to the via hole 9 at the inner wall thereof, adhesion of the reaction inhibiting materials such as amine floating in air to the insulating film can be suppressed, thereby preventing occurrence of poisoning. Inventors of this invention have found out that, in addition to amine, elements such as nitrogen, hydrogen, carbon, etc. also function as the reaction inhibiting materials. Therefore, the poisoning based on the above elements also can be suppressed effectively, because the concentration of nitrogen, hydrogen, carbon, etc. in the modified film 19 exposed to the via hole 9 at the inner wall thereof is lower than that in the inner portion of the insulating film.

Figure 19:
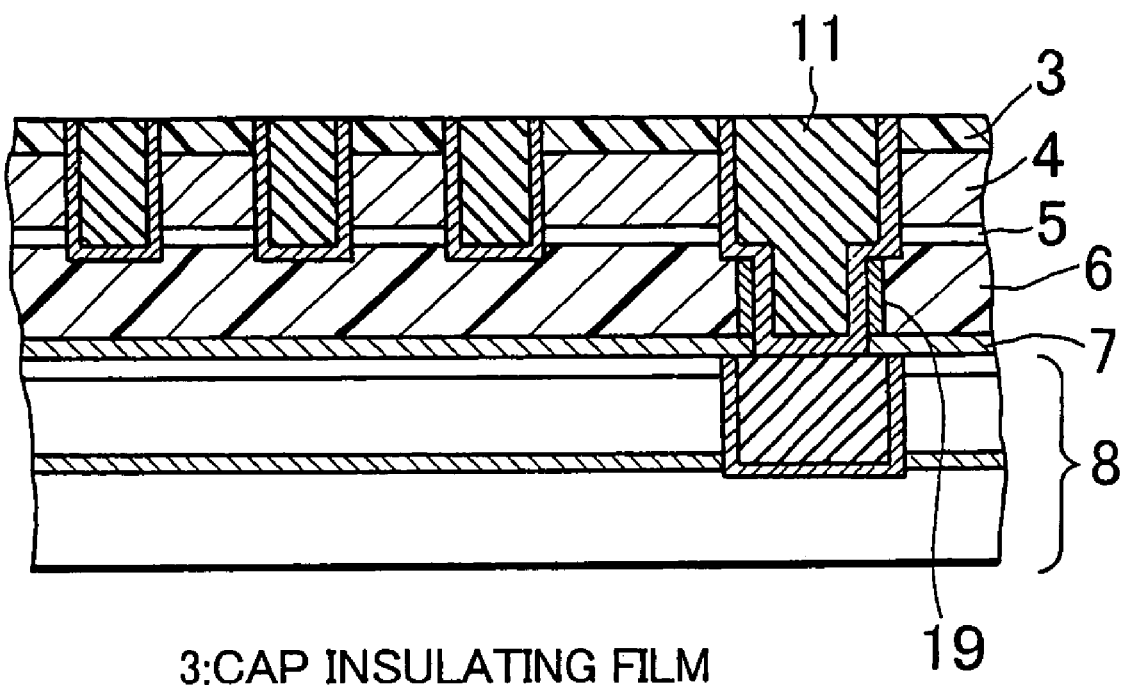
FIG. 19 is a cross-sectional view showing the procedure of the via first process according to the fourth embodiment of the present invention.
Figure 22:
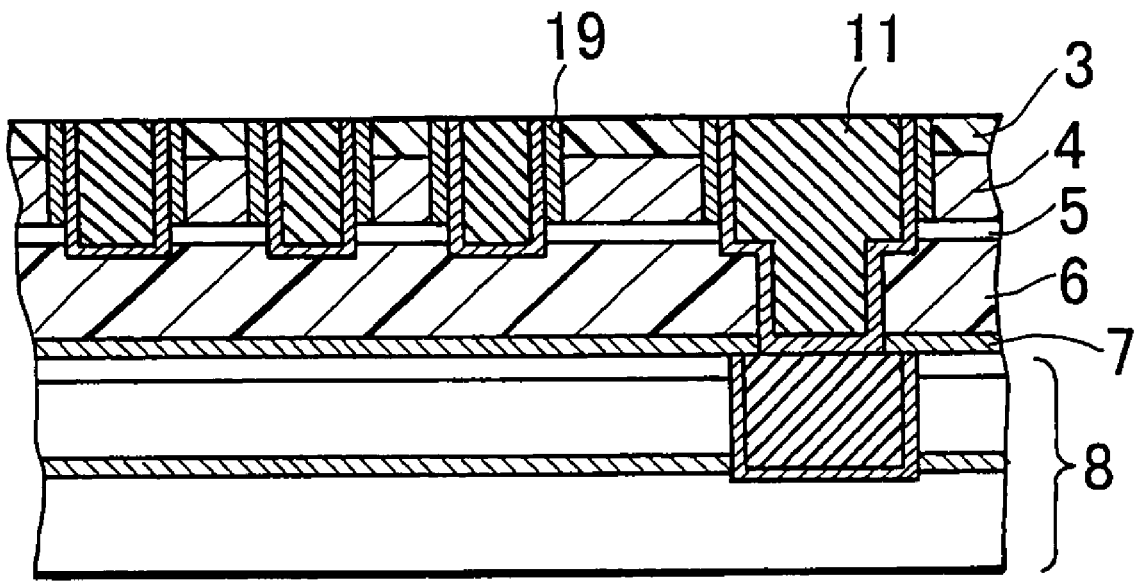
FIG. 22 is a cross-sectional view showing the procedure of the trench first process according to the fourth embodiment of the present invention.

Subsequently, as shown in FIG. 18C, the second resist pattern 1b used for the wiring trench pattern etching is removed, and then the first etching stop film 7 at the bottom of the via hole 9 is removed by etching while the exposed second etching stop film 5 is also etched and removed. Thereafter, wiring materials 11 formed of a barrier film made of, for example, Ta, TaN, Ti, TiN, or the laminated structure thereof and a conducting film made of Cu or the like is embedded in the wiring trench pattern 10 and the via hole 9 simultaneously. Thereafter, as shown in FIG. 19, a portion of the wiring materials 11 which is unnecessary for forming the wire is removed by CMP method to form the wire of dual damascene structure.

As mentioned in the above, by conducting the UV treatment, the annealing treatment, or the combination thereof after the via hole 9 is formed, amine contained in the organic peeling liquid or washing liquid can be surely removed, and by forming the modified film 19 having a modified composition, density or bond state at the face layer portion of the insulating film exposed to the via hole 9 at the inner wall thereof, adhesion of amine floating in air to the insulating film can be suppressed and influence of the reaction inhibiting materials in the insulating film can be also suppressed.

Next, a process wherein the pre-treatment is applied to the trench-first process is described in detail with reference to FIGS. 20A to 22.

First, the first etching stop film 7, the first interlayer insulating film 6, the second etching stop film 5, the second interlayer insulating film 4 and the cap insulating film 3 are successively formed on the wiring substrate 8 having the lower-layer wire 18 in the same manner as the above via-first process (See FIGS. 20A and 20B).

Subsequently, as shown in FIG. 20C, the first resist pattern 1a is formed by the well-known lithography technique, and then an area where the wire is formed is etched to form the wiring trench pattern 10.

Subsequently, as shown in FIG. 21A the first resist pattern 1a used for the wiring trench pattern etching is removed by oxygen ashing, organic peeling liquid, etc., then the modified film 19 is formed at the face layer portion of the insulating films exposed to the wiring trench pattern 10 at the inner wall thereof by the UV treatment, the annealing treatment at about 200 to 450° C. or the combination thereof in the same manner as the above process. A resist poisoning during the formation of the via hole resist pattern in the next step can be suppressed.

Subsequently, as shown in FIG. 21B, the second resist pattern 1b is formed by the well-known lithography technique, and the via hole 9 is formed by the well-known etching technique. Thereafter, the wire is formed in the same manner as the via-first process (See FIGS. 21C and 22).

As mentioned in the above, also in the trench-first process, by conducting the UV treatment, the annealing treatment, or the combination thereof after the wiring trench pattern 10 is formed, amine contained in the organic peeling liquid or washing liquid can be surely removed, and by forming the modified film 19 having a modified composition, density or bond state at the face layer portion of the insulating film exposed to the wiring trench pattern 10 at the inner wall thereof, adhesion of amine floating in air to the insulating film can be suppressed and influence of the reaction inhibiting materials in the insulating film can be also suppressed.

The property and effect of the modified film 19 where various materials are used as the insulating film are described hereunder.

<SiO$_2$ Film>

When the SiO$_2$ film is used as the interlayer insulating film exposed to the via hole 9 in the via-first process, the nitrogen concentration of the SiO$_2$ film at the face layer portion thereof after conducting the process flow (UV treatment or/and annealing treatment) is relatively lower than that of the SiO$_2$ film at the inner portion thereof. Therefore, nitrogen elimination amount from the SiO$_2$ film at the later step is reduced. There is a clear correlation between the nitrogen elimination amount and the via poisoning, where defects caused by the via poisoning increase as the nitrogen elimination amount increases. Accordingly, it can be understood that the poisoning can be suppressed effectively by the pre-treatment of this example when the SiO$_2$ film is used as the interlayer insulating film.

<L-Ox™>

When the ladder oxide film, one of ladder hydrogenated siloxane, is used as the interlayer insulating film exposed to the wiring trench pattern in the trench-first process, the density of the ladder oxide film at the face layer portion thereof after conducting the process flow (UV treatment or/and annealing treatment) is relatively greater than that of the ladder oxide film at the inner portion thereof. Therefore, amine amount taken up into the ladder oxide film at the organic peeling step performed by using a chemical solution containing the amine as a component is reduced. On the other hand, in the conventional process, the amine amount taken up into the ladder oxide film is considerably increased, because the density of the ladder oxide film at the face layer portion thereof is not made greater.

The amine amount taken up into the ladder oxide film can be easily detected by TDS (Thermal Desorption Spectroscopy) prior to metal embedding step of the dual damascene process in terms of the nitrogen elimination amount or the gas elimination amount with nitrogen bond. With such a detection, it is confirmed that defects caused by the resist poisoning increase as the amine uptake amount increases. If the UV treatment time is prolonged, the density of the ladder oxide film becomes greater and accordingly the amount of amine taken up into the ladder oxide film becomes smaller, whereby the defects can be greatly reduced.

Furthermore, the composition of the ladder oxide film at the face layer portion thereof after conducting the process flow (UV treatment or/and annealing treatment) is relatively greater in oxygen concentration and relatively smaller in hydrogen concentration than those of the ladder oxide film at the inner portion thereof.

Furthermore, as to the bond state, the ratio of Si—O bond in the ladder oxide film is relatively higher at the face layer portion thereof than at the inner portion thereof, while the ratio of Si—H bond in the ladder oxide film is relatively lower at the face layer portion thereof than at the inner portion thereof. Such a bond state can be easily detected by FTIR method if the pre-treatment of the process flow is carried out on an uniform film. Also in the actual structure, the bond state can be determined by observation of cross-sectional SEM of the cleavage sample after relief etching with use of a buffered HF. That is, if the face layer portion of the ladder oxide film becomes to have the above bond state, the etching rate thereof becomes significantly low so that the face layer portion tends to be retained in etching, while the etching rate of the inner portion of the ladder oxide film remains rather higher so that the inner portion tends to be removed in etching. Thus, the bond state can be easily detected. With this method, it was determined that the thickness of the modified film 19 was 30 nm or less and it was not increased when prolonging the duration of time of the UV treatment or the annealing treatment. It was also determined that the oxygen concentration was highest at the face layer portion and gradually changed toward the inside. There is a correlation between the bond state and the film density, and the amount of amine taken up into the ladder oxide film tends to become lower as the ratio of Si—O bond increases and the ratio of Si—H bond decreases. Accordingly, it can be understood that the poisoning can be suppressed effectively by the pre-treatment of this example when the ladder oxide film is used as the interlayer insulating film.

In the above insulating film, the element concentration, the density and the bond state is gradually varied from the outer surface of the face layer portion toward the inner portion, that is, the quality of the face layer portion approaches to the quality of a portion of the film other than the face layer portion (the quality of the bulk interlayer insulating film) toward the inner portion. The face layer portion has a dielectric constant higher than the bulk, and therefore if the face layer portion is thick the performance of the device is made lower. When a film having the structure where the quality of the film is steeply varied is used, the thickness of the high dielectric constant face layer portion should be thick. Therefore, if a film having the structure where the quality of the film is gradually varied from the face layer portion to the inner portion is used, the effective dielectric constant can be maintained lower as compared with the structure where the quality of the film is steeply varied, so that sufficient performance of the device can be achieved.

<SiOC Film>

When the SiOC film is used as a part of the interlayer insulating film exposed to the via hole in the via-first process, the density of the SiOC film at the face layer portion thereof after conducting the process flow (UV treatment or/and annealing treatment) is relatively greater than that of the SiOC film at the inner portion thereof. Therefore, the amount of amine taken up into the SiOC film is reduced. On the other hand, in the conventional process, the amount of amine taken up into the SiOC film is considerably increased, because the density of the SiOC film at the face layer portion thereof is not made greater.

As to the composition of the SiOC film after conducting the process flow (UV treatment or/and annealing treatment), the face layer portion is relatively higher in oxygen concentration and relatively lower in carbon and hydrogen concentrations than those of the SiOC film at the inner portion thereof, and as such a tendency becomes more remarkable the amount of amine taken up into the SiOC film becomes lower.

As to the bond state of the SiOC film, the face layer portion is relatively higher in the ratio of Si—O bond and relatively lower in the ratio of Si—H$_3$ bond than those of the SiOC film at the inner portion thereof. There is a correlation between the bond state and the film density, and the amount of amine taken up into the SiOC film tends to become lower as the ratio of Si—CH$_3$ bond decreases. Accordingly, it can be understood that the poisoning can be suppressed effectively by the pre-treatment of this example when the SiOC film is used as the interlayer insulating film.

In the above insulating film, the element concentration, the density and the bond state is gradually varied from the outer surface of the face layer portion toward the inner portion, that is, the quality of the face layer portion approaches to the quality of a portion of the film other than the face layer portion (the quality of the bulk interlayer insulating film) toward the inner portion. The face layer portion has a dielectric constant higher than the bulk, and therefore if the face layer portion is thick the performance of the device is made lower. When a film having the structure where the quality of the film is steeply varied is used, the thickness of the high dielectric constant face layer portion should be thick. Therefore, if a film having the structure where the quality of the film is gradually varied from the face layer portion to the inner portion is used, the effective dielectric constant can be maintained lower as compared with the structure where the quality of the film is steeply varied, so that sufficient performance of the device can be achieved.

<SiCN Film>

When the SiCN film is used as the barrier film or the etching stop film, the density of the SiCN film at the face layer portion thereof after conducting the process flow (UV treatment or/and annealing treatment) is relatively greater than that of the SiCN film at the inner portion thereof. Therefore, the amount of amine taken up into the SiCN film is reduced. On the other hand, in the conventional process, the amount of amine taken up into the SiCN film is considerably increased, because the density of the SiCN film at the face layer portion thereof is not made greater.

As to the composition of the SiCN film after conducting the process flow (UV treatment or/and annealing treatment), the face layer portion is relatively higher in oxygen concentration and relatively lower in carbon, nitrogen and hydrogen concentrations than those of the SiCN film at the inner portion thereof and as such a tendency becomes more remarkable the amount of nitrogen eliminating from the face layer portion of the SiCN film becomes lower.

As to the bond state of the SiCN film, the face layer portion is relatively higher in the ratio of Si—CH$_3$ bond than that of the SiCN film at the inner portion thereof. There is a correlation between the bond state and the film density, and the amount of amine taken up into the SiCN film tends to become lower as the ratio of Si—CH$_3$ bond decreases. Accordingly, it can be understood that the poisoning can be suppressed effectively by the pre-treatment of this example when the SiCN film is used as the barrier film or the etching stop film.

In the above insulating film, the element concentration, the density and the bond state is gradually varied from the outer surface of the face layer portion toward the inner portion, that is, the quality of the face layer portion approaches to the quality of a portion of the film other than the face layer portion (the quality of the bulk interlayer insulating film) toward the inner portion. The face layer portion has a dielectric constant higher than the bulk, and therefore if the face layer portion is thick the performance of the device is made lower. When a film having the structure where the quality of the film is steeply varied is used, the thickness of the high dielectric constant face layer portion should be thick. Therefore, if a film having the structure where the quality of the film is gradually varied from the face layer portion to the inner portion is used, the effective dielectric constant can be maintained lower as compared with the structure where the quality of the film is steeply varied, so that sufficient performance of the device can be achieved.

<SiC Film>

When the SiC film is used as the barrier film or the etching stop film, the density of the SiC film at the face layer portion thereof after conducting the process flow (UV treatment or/and annealing treatment) is relatively greater than that of the SiC film at the inner portion thereof. Therefore, the amount of amine taken up into the SiC film is reduced. On the other hand, in the conventional process, the amount of amine taken up into the SiC film is considerably increased, because the density of the SiC film at the face layer portion thereof is not made greater.

As to the composition of the SiC film after conducting the process flow (UV treatment+annealing treatment), the face layer portion is relatively higher in oxygen concentration and relatively lower in carbon and hydrogen concentrations than those of the SiC film at the inner portion thereof, and as such a tendency becomes more remarkable the amount of amine taken up into the face layer portion of the SiC film becomes lower. There is a correlation between the bond state and the film density, and the amount of amine taken up into the SiC film tends to become lower as the ratio of Si—CH$_3$ bond decreases. Accordingly, it can be understood that the poisoning can be suppressed effectively by the pre-treatment of this example when the SiC film is used as the barrier film or the etching stop film.

In the above insulating film, the element concentration, the density and the bond state is gradually varied from the outer surface of the face layer portion toward the inner portion, that is, the quality of the face layer portion approaches to the quality of a portion of the film other than the face layer portion (the quality of the bulk interlayer insulating film) toward the inner portion. The face layer portion has a dielectric constant higher than the bulk, and therefore if the face layer portion is thick the performance of the device is made lower. When a film having the structure where the quality of the film is steeply varied is used, the thickness of the high dielectric constant face layer portion should be thick. Therefore, if a film having the structure where the quality of the film is gradually varied from the face layer portion to the inner portion is used, the effective dielectric constant can be maintained lower as compared with the structure where the quality of the film is steeply varied, so that sufficient performance of the device can be achieved.

In the above examples, the annealing treatment, the plasma treatment, the UV treatment, the organic solvent treatment, etc. of the present invention are applied to the dual damascene process such as the via-first process, the dual hard mask process or the trench-first process, however, the present invention is not limited to the above examples. For example, the present invention may be applied to any semiconductor process containing a step of forming a resist pattern subsequently to the wet treatment using organic peeling liquid or washing liquid containing basic materials such as amine components, hydrofluoric acid hydrogen peroxide or the like, or a step of forming a resist pattern subsequently to the patterning of the insulating film.

As described above, according to the semiconductor device and its manufacturing method of the present invention, the following advantages can be achieved.

A first advantage of the present invention resides in that in the process containing the step of forming the resist pattern subsequently to the wet treatment using the organic peeling liquid or washing liquid containing amine or the like as in the case of the dual damascene process such as the via-first process, the dual hard mask process, the trench-first process or the like, or the step of forming the resist pattern subsequently to formation of the via hole or the wiring trench pattern, the problem of the degradation in the resist pattern resolution can be solved.

This is because the reaction inhibiting materials such as amine, etc. remaining in the wafer, particularly in the low dielectric-constant interlayer insulating film can be surely removed by performing the treatment such as the annealing treatment, the plasma treatment, the UV treatment, the organic solvent treatment or the like as the pre-treatment to form the resist pattern. In addition, by conducting the UV treatment or the annealing treatment, the modified film having a modified quality (composition, density, bond state, etc.) exposed to the via hole or the wiring trench pattern at the face layer portion of the insulating film, to thereby suppress adhesion of amine floating in air and suppress influence of the reaction inhibiting materials, i.e. specific elements in the insulating film.

A second advantage of the present invention resides in that the coating of the antireflection coating, etc. can be facilitated and the processing precision of the resist pattern can be enhanced.

This is because the surface state can be reformed by the plasma treatment or the UV treatment, so that the wettability of the antireflection coating and the resist can be improved.

As described above, in the conventional dual damascene process using the conventional low dielectric constant film, no stable resist processing shape cannot be achieved due to the reaction inhibiting materials such as amine or the like. However, by performing the pre-treatment of the present invention, stable resist resolution can be achieved, and it can contribute to enhancement in yield.

What is claimed is:

1. A semiconductor device manufacturing method comprising the steps of:
   conducting a wet treatment using organic peeling liquid or cleaning liquid on a substrate having an insulating film formed thereon and then forming a resist pattern on the insulating film,
   wherein before a resist serving as the resist pattern or antireflection coating provided between the insulating film and the resist is coated subsequently to the wet treatment, an organic solvent pre-treatment for removing reaction inhibiting materials which are contained in the organic peeling liquid or the cleaning liquid and inhibit the chemical reaction of the resist is conducted,
   wherein the organic solvent pre-treatment uses an organic solvent containing any one of polypyreneglycol monomethyl ether acetate, polypyreneglycol monomethyl ether, ethyl lactate, cyclohexanone and methyl ethyl ketone.

2. The semiconductor device manufacturing method as claimed in claim 1, wherein the insulating film comprises a low dielectric-constant film.

3. A semiconductor device manufacturing method comprising the steps of:
   successively depositing at least a first interlayer insulating film and a second interlayer insulating film on a substrate on which a wiring pattern is formed;
   forming a first resist pattern on the second interlayer insulating film and forming via holes by dry etching using the first resist pattern as a mask so that the via holes penetrate through the first interlayer insulating film and the second interlayer insulating film;
   conducting at least one wet treatment of removing etching residual materials with organic peeling liquid and a treatment of cleaning with cleaning liquid;
   forming a second resist pattern on the second interlayer insulating film;
   etching the second interlayer insulating film by using the second resist pattern as a mask to form wiring trench patterns; and
   embedding wiring material in the via holes and the wiring trench patterns and polishing the surface of the wiring material thus embedded to thereby form a wiring pattern,
   wherein before a resist serving as the second resist pattern or antireflection coating provided between the second insulating film and the resist is coated subsequently to the wet treatment, an organic solvent pre-treatment for removing reaction inhibiting materials which are contained in the organic peeling liquid or the cleaning liquid and inhibit the chemical reaction of the resist is conducted,
   wherein the organic solvent pre-treatment uses an organic solvent containing any one of polypyreneglycol monomethyl ether acetate, polypyreneglycol monomethyl ether, ethyl lactate, cyclohexanone and methyl ethyl ketone.

4. The semiconductor device manufacturing method as claimed in claim 1, wherein the organic solvent contains acidic material so that the reaction inhibiting materials infiltrated into or adsorbed to the insulating film, the first interlayer insulating film or the second interlayer insulating film are neutralized by the acidic material.

5. The semiconductor device manufacturing method as claimed in claim 1, wherein the organic solvent contains weakly basic material so that the reaction inhibiting materials infiltrated into or adsorbed to the insulating film, the first interlayer insulating film or the second interlayer insulating film are substituted into the weakly basic materials.

* * * * *